US010760165B2

(12) United States Patent
Atkins et al.

(10) Patent No.: US 10,760,165 B2
(45) Date of Patent: Sep. 1, 2020

(54) CATHODIC PROTECTION MANAGEMENT SYSTEM

(71) Applicant: Sensus Spectrum LLC, Raleigh, NC (US)

(72) Inventors: Christopher Michael Atkins, Wake Forest, NC (US); Jacob Peter Schirm, West Linn, OR (US); Kevin Michael Shay, Cary, NC (US)

(73) Assignee: Sensus Spectrum LLC, Raleigh, NC (US)

( * ) Notice: Subject to any disclaimer, the term of this patent is extended or adjusted under 35 U.S.C. 154(b) by 562 days.

(21) Appl. No.: 14/742,859

(22) Filed: Jun. 18, 2015

(65) Prior Publication Data
US 2015/0368809 A1    Dec. 24, 2015

Related U.S. Application Data

(60) Provisional application No. 62/013,580, filed on Jun. 18, 2014.

(51) Int. Cl.
*C23F 13/04* (2006.01)
*G01R 19/00* (2006.01)
*C23F 13/22* (2006.01)

(52) U.S. Cl.
CPC .............. *C23F 13/04* (2013.01); *C23F 13/22* (2013.01); *G01R 19/0084* (2013.01); *C23F 2213/32* (2013.01)

(58) Field of Classification Search
CPC .......................... C23F 13/04; C23F 2213/32
See application file for complete search history.

(56) References Cited

U.S. PATENT DOCUMENTS 4,828,665 A * 5/1989 McCready .............. C23F 13/02
                                                           204/196.03
5,026,468 A * 6/1991 Carpenter ............... C23F 13/04
                                                              136/291

(Continued)

FOREIGN PATENT DOCUMENTS

CN         202141690 U      2/2012
CN         203241783 U     10/2013
WO       2009/019717 A1    2/2009

OTHER PUBLICATIONS

PCT International Search Report and Written Opinion dated Sep. 18, 2015.

(Continued)

*Primary Examiner* — Salil Jain
(74) *Attorney, Agent, or Firm* — Andus Intellectual Property Law, LLP

(57) ABSTRACT

A cathodic protection system that is able to monitor the operational status of a plurality of test points and rectifiers. The cathodic protection system includes a plurality of test point monitors that are associated with test points and a plurality of rectifier controllers that are associated with the rectifiers located along a utility pipeline. The test point monitors are battery powered while the rectifier controllers may be utility line powered. Each of the test point monitors and rectifier controllers communicates with a base station utilizing a wireless communication technique. The base station communicates with a back end server that operates to accumulate data and visually present the data to an operator on a display associated with cathodic protection software application. The software application allows the operator to monitor the health of the system and address alerts generated by any of the test points or monitored rectifiers.

7 Claims, 23 Drawing Sheets

(56) References Cited

U.S. PATENT DOCUMENTS

| | | | | |
|---|---|---|---|---|
| 5,184,311 A | * | 2/1993 | Kraus | G01V 3/40 |
| | | | | 324/345 |
| 8,484,138 B2 | | 7/2013 | Cahill-O'Brien et al. | |
| 2002/0196008 A1 | * | 12/2002 | Hilleary | C23F 13/22 |
| | | | | 324/72 |
| 2003/0189435 A1 | | 10/2003 | Yunovich et al. | |
| 2008/0204274 A1 | | 8/2008 | Peters | |
| 2010/0121578 A1 | * | 5/2010 | Davis | G01N 17/02 |
| | | | | 702/2 |
| 2011/0193577 A1 | | 8/2011 | Spruth et al. | |
| 2011/0238347 A1 | * | 9/2011 | Gemperli | C23F 13/04 |
| | | | | 702/65 |

OTHER PUBLICATIONS

International Preliminary Report on Patentability and Written Opinion dated Dec. 29, 2016.
Office Action for copending Chinese Patent Application No. 201580032462.4 dated Jul. 27, 2018.

* cited by examiner

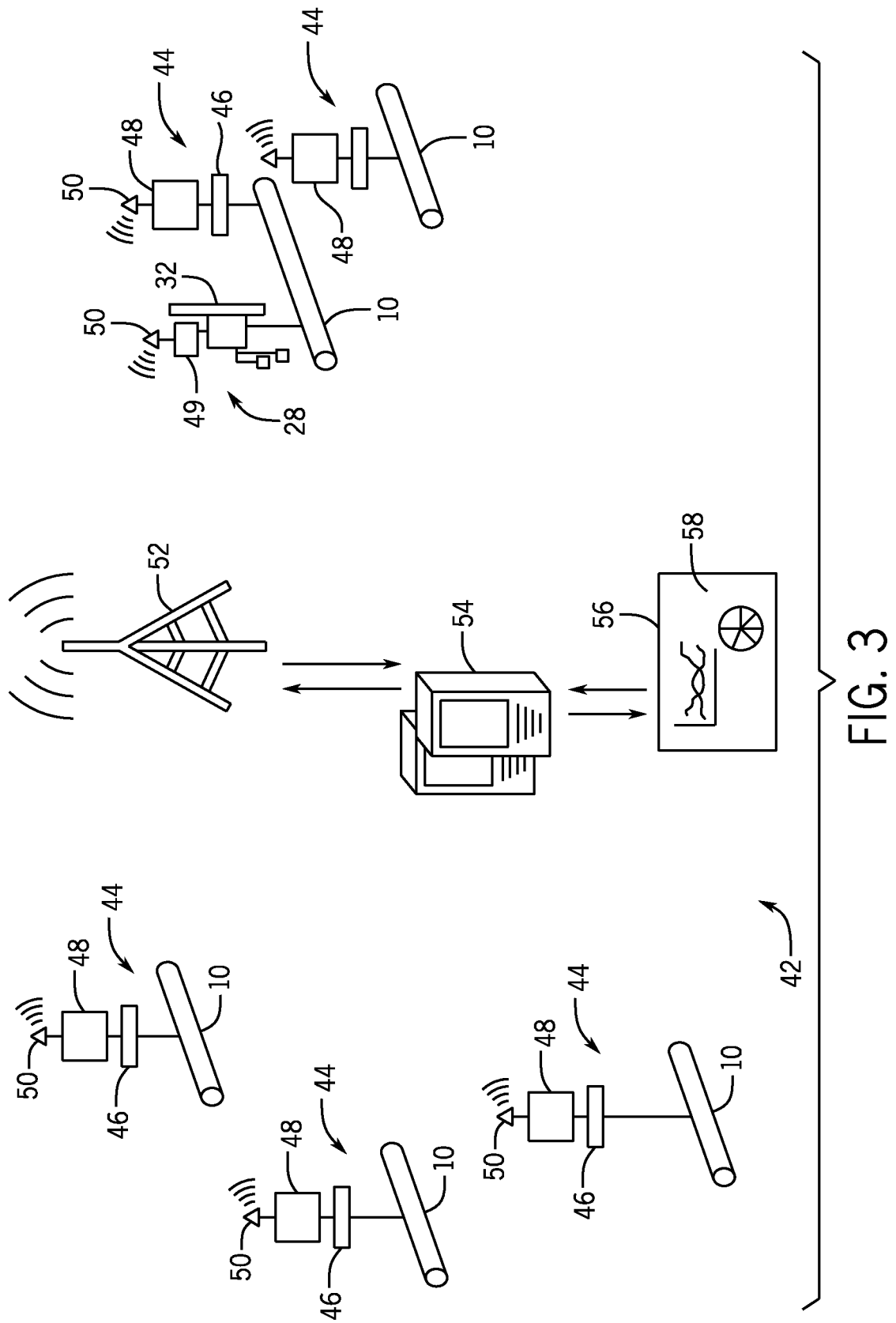

FIG. 17

| ACME Gas and Electric >> Cathodic Protection | | | | | Welcome jschirm \| System Settings \| FlexNet Home \| Log Out | | |
|---|---|---|---|---|---|---|---|
| Alerts \| Rectifiers \| Test Points \| Analytics | | | | | Search | | |
| All | | | | | Export: ☑CSV | ▥ List ☑ Hybrid ☐ Map | |
| Clear | ↓ ☐▾ ☑ Actions▾ 0 Alerts Selected — 154 | | | | | | 50 Alerts |
| Follow-Up | | | | | 160 | 162 | |
| New | | | | | | | |
| Ticketed | 156 158 | | | | | | |
| ALARMS | ☐ Alert | Location | Pipeline | Type | Protection | Least Read | Actions Map Received ▾ |
| ☐ All Alarms | ☐ DC Voltage Alarm [New] TEST POINT TP-UNIVERSITY-11 | Between 230 and 240 University | PDX-543 | Test Point | Galvanic | -0.825V | Actions▾ ⌖ 6:34:00 PM |
| ☐ AC Voltage Alarm | ☐ DC Voltage Warning [New] TEST POINT TP-MAPLE-01 | 3435-6 Maple Street | PDX-098 | Test Point | Galvanic | -0.862V | Actions▾ ⌖ 4:24:00 PM |
| ☐ DC Current Alarm | ☐ DC Current Alarm [New] RECTIFIER R-2 MAPLE STREET | Corner 500 Maple Street | PDX-345 | Rectifier | Impressed Current | 35 Amps | Actions▾ ⌖ 1:24:12 PM |
| ☐ DC Voltage Alarm | ☐ DC Voltage Alarm [New] TEST POINT TP-LOWER-MAPLE-03 | East Lower Maple Street | GR-987 | Test Point | Galvanic | -0.809V | Actions▾ ⌖ 1:10:12 PM |
| ☐ Tamper Alarm | ☐ DC Voltage Alarm [New] TEST POINT TP-RF123-MIDHILL-05 | 200-23 Midhill | PDX-093 | Test Point | Galvanic | -0.815V | Actions▾ ⌖ 12:14:45 PM |
| WARNINGS | ☐ DC Voltage Alarm [Follow-Up] TEST POINT TP-R5543-BOONES-06 | Upper Boones between 3rd and 5th | PDX-890 | Test Point | Galvanic | -0.806V | ⌖ 10:15:12 AM |
| ☐ All Warnings | ☐ DC Voltage Warning [Cleared] TEST POINT TP-EAST-HAVARD-01 | 143 Havard Circle | PDX-409 | Test Point | Galvanic | -0.800V | YESTERDAY 10:14:00 PM |
| ☐ DC Voltage Warning | ☐ DC Voltage Warning [Follow-Up] TEST POINT TP-NW-THIRD-01 | NW Third Street at Boone | HIL-462 | Test Point | Galvanic | -0.800V | Actions▾ ⌖ YESTERDAY 9:10:15 PM |
| ☐ Current Interrupted | ☐ DC Voltage Alarm [Follow-Up] TEST POINT TP-JOLIE-POINT-03 | Lower Jolie Point | PDX-543 | Test Point | Galvanic | -0.798V | ⌖ YESTERDAY 6:31:00 AM |
| ☐ DC Current Warning | ☐ DC Voltage Alarm [Ticketed] TEST POINT TP-RF456-DOLLAR-03 | 224-5 Dollar Street | PDX-543 | Test Point | Galvanic | -0.814V | Actions▾ ⌖ 06/17/2013 11:14:12 PM |
| ☐ DC Voltage Warning | ☐ DC Voltage Alarm [Follow-Up] TEST POINT TP-LOWER-MAPLE-03 | East Lower Maple Street | Test Point | PDX-839 | Galvanic | -0.811V | Actions▾ ⌖ 06/17/2013 9:24:14 PM |
| ☐ No Communication | ☐ DC Voltage Alarm [Follow-Up] TEST POINT TP-WEST-MARBE-01 | 2nd and Marbe Street | PDX-002 | Test Point | Galvanic | -0.831V | Actions▾ ⌖ 06/17/2013 6:12:24 PM |
| ☐ Survey Overdue | ☐ DC Voltage Alarm [Cleared] TEST POINT TP-WINDLE-WAY-01 | East Windle Way | PDX-209 | Test Point | Galvanic | -0.832V | Actions▾ ⌖ 06/17/2013 2:24:15 PM |
| PROTECTION TYPE | ☐ DC Voltage Alarm [Follow-Up] TEST POINT TP-RF654-UNIVERSITY-12 | University between 3rd and 4th | PDX-369 | Test Point | Impressed Current | -0.799V | ⌖ 06/17/2013 11:24:12 PM |
| ☐ All Types | ☐ DC Voltage Alarm [Cleared] TEST POINT TP-RF654-UNIVERSITY-13 | University between 3rd and 4th | WL-001 | Test Point | Impressed Current | -0.818V | ⌖ 06/17/2013 8:34:16 PM |
| ☐ Galvanic | | | | | | | |
| ☐ Impressed Current | | | | | | | |
| PIPELINE ▸ | | | | | | | |
| ☐ All Rectifiers | | | | | | | |
| ☐ PDX 002 | | | | | | | |
| ☐ PDX 003 | | | | | | | |
| ☐ PDX 004 | | | | | | | |
| ☐ PDX 005 | | | | | | | |
| ☐ PDX 006 | | | | | | | |
| 7 more... ▸ | | | | | | | |
| TAGS | | | | | | | |

FIG. 18

| | Rectifier | Location | City | Network Address | Input AC | Output DC | Output DC Current | Last Survey Date | Test Points | Alerts |
|---|---|---|---|---|---|---|---|---|---|---|
| ☐ | R-Maple Street | 34353 Maple Street | Portland | FNID#36234234543 | 120v | 50v | 50AMPS | 6/1/3013 | ⚑20 | TAMPER DOOR OPEN 6/15/2013 - 12:34:10am |
| ☐ | R-2 Maple Street | 14353 Maple Street | Portland | FNID#36234234543 | 120v | 50v | 50AMPS | 5/12/3013 | ⚑32 | TAMPER DOOR OPEN 6/15/2013 - 12:34:00 |
| ☐ | R-3 Maple Street | 34353 Maple Street | Portland | FNID#36234234543 | 120v | 50v | 50AMPS | 4/22/3013 | ⚑41 | TAMPER DOOR OPEN 4/12/2013 - 12:34:00 |
| ☐ | R-5 Maple Street | 14353 Maple Street | Portland | FNID#36234234543 | 120v | 50v | 50AMPS | 6/1/3013 | ⚑35 | TAMPER DOOR OPEN 6/15/2013 - 12:34:00 |
| ☐ | R-5 Maple Street | 34353 Maple Street | Portland | FNID#36234234543 | 120v | 50v | 50AMPS | 5/12/3013 | ⚑29 | TAMPER DOOR OPEN 4/12/2013 - 12:34:00 |
| ☐ | R-Elm Street | 153 Elm | Portland | FNID#36234234543 | 120v | 50v | 50AMPS | 6/1/3013 | ⚑33 | TAMPER DOOR OPEN 6/15/2013 - 12:34:00 |
| ☐ | R-2 Elm Street | 2353 Elm | Portland | FNID#36234234543 | 120v | 50v | 50AMPS | 5/12/3013 | ⚑27 | TAMPER DOOR OPEN 4/12/2013 - 12:34:00 |
| ☐ | R-3 Elm Street | 4234 Elm | Portland | FNID#36234234543 | 120v | 50v | 50AMPS | 6/1/3013 | ⚑42 | TAMPER DOOR OPEN 6/15/2013 - 12:34:00 |
| ☐ | R-4 Elm Street | 22353 Elm | Portland | FNID#36234234522 | 120v | 50v | 50AMPS | 5/12/3013 | ⚑35 | TAMPER DOOR OPEN 4/12/2013 - 12:34:00 |
| ☐ | R-5 Elm Street | 14353 Elm | Portland | FNID#36234234098 | 120v | 50v | 50AMPS | 4/22/3013 | ⚑32 | TAMPER DOOR OPEN 6/15/2013 - 12:34:00 |
| ☐ | R-6 Elm Street | 34353 Elm | Portland | FNID#36234234543 | 120v | 50v | 50AMPS | 6/1/3013 | ⚑22 | TAMPER DOOR OPEN 4/12/2013 - 12:34:00 |
| ☐ | R-7 Elm Street | 14353 Elm | Portland | FNID#36234234443 | 120v | 50v | 50AMPS | 5/12/3013 | ⚑36 | TAMPER DOOR OPEN 6/15/2013 - 12:34:00 |
| ☐ | R-8 Elm Street | 34353 Elm | Portland | FNID#36234234543 | 120v | 50v | 50AMPS | 4/22/3013 | ⚑35 | TAMPER DOOR OPEN 4/12/2013 - 12:34:00 |
| ☐ | R Broadway | 1 Broadway | Portland | FNID#36234234543 | 120v | 50v | 50AMPS | 5/12/3013 | ⚑50 | TAMPER DOOR OPEN 3/22/2013 - 12:34:00 |
| ☐ | R-1 Broadway | 10 Broadway | Portland | FNID#36234234351 | 120v | 50v | 50AMPS | 5/12/3013 | ⚑40 | TAMPER DOOR OPEN 6/15/2013 - 12:34:00 |
| ☐ | R-2 Broadway | 24353 Broadway | Portland | FNID#36234234789 | 120v | 50v | 50AMPS | 5/12/3013 | ⚑50 | TAMPER DOOR OPEN 3/22/2013 - 12:34:00 |

| | Test Point | Location | City | Network Address | Protection Type | Rectifier | Last Survey Date | Last Road | Map | Alerts |
|---|---|---|---|---|---|---|---|---|---|---|
| ☐ | TP-Maple-street-01 | 34353 Maple Street | Portland | FNID#3T2342345434 | Impressed Current | R-Maple Street | 5/12/3013 | -0.825v TODAY | ♀ | DC VOLTAGE ALARM 6/15/2013 - 12:34:00 |
| ☐ | TP-Maple-street-02 | 32614 Maple Street | Portland | FNID#3T2342345145 | Impressed Current | R-Maple Street | 5/12/3013 | -0.828v TODAY | ♀ | DC VOLTAGE ALARM 6/15/2013 - 12:34:00 |
| ☐ | TP-Maple-street-03 | 32343 Maple Street | Portland | FNID#3T2342345433 | Impressed Current | R-Maple Street | 5/12/3013 | -0.822v TODAY | ♀ | DC VOLTAGE ALARM 6/15/2013 - 12:34:00 |
| ☐ | TP-Maple-street-04 | 31314 Maple Street | Portland | FNID#3T2342345189 | Impressed Current | R-Maple Street | 5/12/3013 | -0.821v TODAY | ♀ | DC VOLTAGE ALARM 6/15/2013 - 12:34:00 |
| ☐ | TP-Maple-street-05 | 30125 Maple Street | Portland | FNID#3T2342345465 | Impressed Current | R-Maple Street | 5/12/3013 | -0.820v TODAY | ♀ | DC VOLTAGE ALARM 6/15/2013 - 12:34:00 |
| ☐ | TP-Maple-street-05 | 29432 Maple Street | Portland | FNID#3T2342345654 | Impressed Current | R-Maple Street | 5/12/3013 | -0.819v TODAY | ♀ | DC VOLTAGE ALARM 6/15/2013 - 12:34:00 |
| ☐ | TP-Maple-street-06 | 32343 Maple Street | Portland | FNID#3T2342345434 | Impressed Current | R-Maple Street | 5/12/3013 | -0.828v TODAY | ♀ | DC VOLTAGE ALARM 6/15/2013 - 12:34:00 |
| ☐ | TP-Maple-street-07 | 32614 Maple Street | Portland | FNID#3T2342345145 | Impressed Current | R-Maple Street | 5/12/3013 | -0.825v TODAY | ♀ | DC VOLTAGE ALARM 6/15/2013 - 12:34:00 |
| ☐ | TP-Maple-street-08 | 34353 Maple Street | Portland | FNID#3T2342345434 | Impressed Current | R-Maple Street | 5/12/3013 | -0.825v TODAY | ♀ | DC VOLTAGE ALARM 6/15/2013 - 12:34:00 |
| ☐ | TP-Maple-street-09 | 32614 Maple Street | Portland | FNID#3T2342345145 | Impressed Current | R-Maple Street | 5/12/3013 | -0.828v TODAY | ♀ | DC VOLTAGE ALARM 6/15/2013 - 12:34:00 |
| ☐ | TP-Maple-street-10 | 34353 Maple Street | Portland | FNID#3T2342345145 | Impressed Current | R-Maple Street | 5/12/3013 | -0.825v TODAY | ♀ | DC VOLTAGE ALARM 6/15/2013 - 12:34:00 |
| ☐ | TP-Maple-street-11 | 32614 Maple Street | Portland | FNID#3T2342345434 | Impressed Current | R-Maple Street | 5/12/3013 | -0.828v TODAY | ♀ | DC VOLTAGE ALARM 6/15/2013 - 12:34:00 |
| ☐ | TP-Maple-street-12 | 34353 Maple Street | Portland | FNID#3T2342345434 | Impressed Current | R-Maple Street | 5/12/3013 | -0.825v TODAY | ♀ | DC VOLTAGE ALARM 6/15/2013 - 12:34:00 |
| ☐ | TP-Maple-street-13 | 32614 Maple Street | Portland | FNID#3T2342345145 | Impressed Current | R-Maple Street | 5/12/3013 | -0.828v TODAY | ♀ | DC VOLTAGE ALARM 6/15/2013 - 12:34:00 |
| ☐ | TP-Maple-street-14 | 34353 Maple Street | Portland | FNID#3T2342345434 | Impressed Current | R-Maple Street | 5/12/3013 | -0.825v TODAY | ♀ | DC VOLTAGE ALARM 6/15/2013 - 12:34:00 |
| ☐ | TP-Maple-street-15 | 32614 Maple Street | Portland | FNID#3T2342345145 | Impressed Current | R-Maple Street | 5/12/3013 | -0.826v TODAY | ♀ | DC VOLTAGE ALARM 6/15/2013 - 12:34:00 |

CATHODIC PROTECTION MANAGEMENT SYSTEM

CROSS REFERENCE TO RELATED APPLICATIONS

The present application is based on and claims priority to U.S. Provisional Patent Application Ser. No. 62/013,580, filed on Jun. 18, 2014, the disclosure of which is incorporated herein by reference.

BACKGROUND

The present disclosure generally relates to a method and system for monitoring cathodic pipeline protection devices. More specifically, the present disclosure relates to a system and method that communicate to both test points and rectifiers of a cathodic protection system and presents status updates and initiates status checks for the devices of the cathodic protection system.

Presently, natural gas is transmitted utilizing gas transmission or distribution pipelines that are buried in the ground. Many of these pipelines are formed from an iron material or an iron alloy, such as steel. Iron-containing materials have an electrical potential of about 0.44 volts. Corrosion of metal occurs when electrons leave the surface of a more negatively charged material (the anode) and flow through an electrolyte to a more positively charged material (the cathode). The difference in voltage potential can exist between one object and another nearby object, or on different parts of the same object. The departure of electrons depletes the material. Additionally, the departure of electrons creates a positively charged ion on the surface of the material, which actively bonds with oxygen or other elements. In the case of an iron-based metal, like steel, the bond with oxygen creates rust and, ultimately corrosion.

Many buried pipelines are formed from iron-including materials. The iron possesses a more negative charge than common soil, which creates the potential for corrosion of the iron pipe. In the natural gas industry, pipeline failure can be catastrophic and thus a significant amount of resources are expended to protect against such corrosion.

Presently, there are two similar but different techniques used to protect gas pipelines from corrosion. The most common technique is referred to as galvanic protection and the less common but more complex method is referred to as impressed current protection. Both of these two common techniques are generally referred to as cathodic protection and both involve manipulating the voltage of the steel pipe so that electrons flow to it rather than flowing away from it. The voltage of the iron-including pipe is manipulated, forcing it to become a cathode, hence the name cathodic protection.

Cathodic protection, such as shown in FIG. 1, is used to describe the technique where a more negatively charged material, such as magnesium or zinc (the anode) is buried in close proximity to the less negatively charged iron gas pipeline the cathode). A wire is used to connect the two different metals to each other to allow electrons to flow between the two materials. The voltage differential between the two dissimilar metals will cause electrons to flow from the anode (magnesium) through the connecting wire to the steel of the pipeline causing the pipeline to become negatively polarized. The polarization on the steel will now attract positive ions from the soil to the steel, thereby halting corrosion of the steel.

By connecting the anode and cathode together as discussed, the resulting electron flow will cause the iron pipe to become polarized and changes the voltage around the midpoint of the natural dynamic voltage of the two materials. Over time, the magnesium anode will become depleted and become ineffective. The magnesium anode is referred to as a sacrificial anode. When the sacrificial anode becomes depleted, it loses the ability to protect the pipe and must be replaced.

The second type of cathodic protection is referred to as impressed current protection and is shown in FIG. 2. In a system that utilizes impressed current protection, a rectifier is used to force electron flow to a gas pipeline to halt corrosion to the steel. In this type of system, an AC powered rectifier converts AC voltage to DC voltage that has a maximum DC output of between 10-50 amps and 50 volts.

The positive DC output terminal is connected via cables to an array of anodes buried in the ground (the anode ground bed). The anodes in the induced current protection system are typically non-active metals or compounds such as platinum, graphite, high silicon iron or other materials. Another cable is connected between the negative terminal of the rectifier and the pipeline.

Since electrons flow from negative to positive, the circuit causes electrons to flow from the anode, through the circuit in the rectifier, to the pipe. At the time of system installation, the operating output of the rectifier is adjusted to an optimum level.

Although the two types of cathodic protection systems work well to protect against corrosion of the steel pipeline, the U.S. Department of Transportation, under the Pipeline and Hazardous Material Safety Administration (PHMSA) requires gas utilities to periodically check the effectiveness of their cathodic protection systems and record the results. The utilities are also required by federal and local laws to correct deficiencies within time frames that vary by different locations.

To satisfy the requirements of the PHMSA, test points are constructed throughout the gas distribution network. These test points are spaced along the length of the pipe sections, regardless of whether the pipe sections are protected by galvanic or impressed current techniques. Each test point must be surveyed not less than once per year.

Since rectifiers are critical elements in the impressed current systems, rectifiers must be surveyed according to regulations at an interval of once every two months.

In some utility applications, the utility may have over 100,000 geographically dispersed test points and over 3,000 rectifiers. Since the 100,000 test points must be surveyed once a year and the 3,000 rectifiers must be surveyed six times a year, this results in 118,000 measurements during a one year period. Since the measurements are currently taken manually, utilities must maintain a very large fleet of vehicles and must expend a significant amount of manpower in making these measurements.

In addition to the physical demands required for the manual readings, the utility is currently unable to monitor the status of the test points between the yearly or bi-monthly measurements. Thus, if a test point malfunctions or the cathodic protection malfunctions during the one year interval between readings, the utility is unable to detect the malfunction until the next reading cycle.

Therefore, a need exists for a system and method that can automatically monitor both galvanic protection test points as well as rectifiers used for impressed current protection.

SUMMARY

The present disclosure relates to a cathodic protection system that includes a plurality of test points and rectifiers that provide cathodic protection to areas and lengths of a pipeline. The system includes a test point monitor associated with each of the test points and a rectifier controller associated with each rectifier of the cathodic protection systems. The test point monitors and rectifier controllers each communicate with a base station, which in turn communicates the received information to a back end server. The back end server includes a software application that presents the received information to an operator in a way that the operator can use to monitor the system health and comply with Federal monitoring guidelines.

In accordance with one aspect of the disclosure, each of the test point monitors and rectifier controllers are instructed to obtain a time synchronization signal such that the test point monitors and rectifier controllers are in time synchronization with each other. The time synchronization of the two devices allows the devices to perform different types of testing and monitoring procedures. As an example, the rectifier controller can interrupt the application of the protection voltage to the pipeline. Each of the test point monitors can then obtain a voltage measurement from the pipeline after a pre-determined time delay from the interruption of the protection voltage.

The test point monitors of the present disclosure each include a control unit. The control unit includes firmware that allows the test point monitor to be configured based on the type of test point. For example, the test point monitor can be configured to interact with multiple different types of test points. In this way, the test point monitor can be configured at installation such that a single type of test point monitor can be used with different types of test points.

The cathodic protection system can further include a base station that is located remotely from the test point monitors and the rectifier controllers. The base station is in wireless communication with both the test point monitors and the rectifier controllers. A back end server is in communication with the base station to receive voltage measurements from the plurality of test point monitors and can also communicate with the test point monitors. The back end server in communication with the base station is operable to instruct the rectifier controller to interrupt the application of the protection voltage to the pipeline and to obtain voltage measurements from the test point monitors.

Various other features, objects and advantages of the invention will be made apparent from the following description taken together with the drawings.

BRIEF DESCRIPTION OF THE DRAWINGS

The drawings illustrate the best mode presently contemplated of carrying out the disclosure. In the drawings:

FIG. 3 is a schematic representation of a system of the present disclosure for communicating between multiple test points and rectifiers;

FIG. 17 is a display showing multiple new, cleared and tagged alerts;

FIG. 18 is a display showing the details of one test point that is generating an alert;

FIG. 22 is a display showing the readings of a series of rectifiers;

FIG. 23 is a display showing the readings of multiple test points;

DETAILED DESCRIPTION

Figure 1:
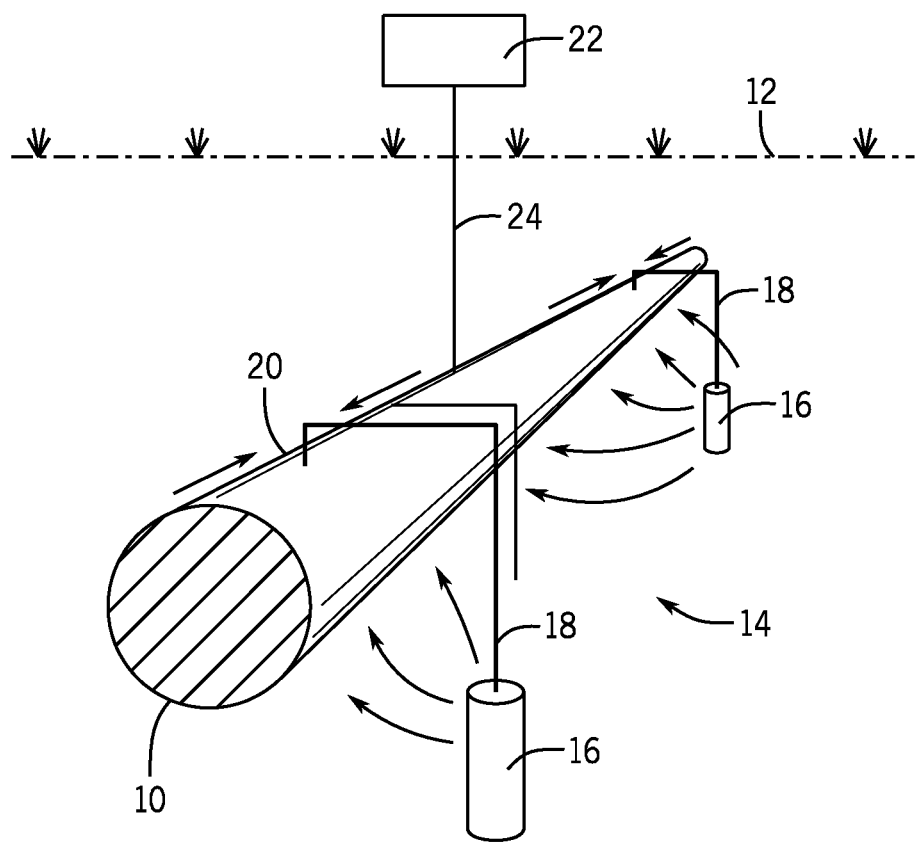
FIG. 1 is a schematic illustration showing the element of a galvanic cathodic protection scheme.

FIG. 1 illustrates a first type of cathodic protection used to reduce and eliminate corrosion in a section of a pipeline 10 formed from an iron containing material, such as but not limited to steel. When a section of pipeline 10 is buried within the ground 12, electrons leave the surface of the more negatively charged material (anode) and flow through an electrolyte to a more positively charged material (the cathode). In the case of iron (or an iron alloy like steel) that forms a gas transmission or distribution pipeline buried in the ground, the iron possesses a more negative charge than soil so that electrons flow from the pipeline to the soil, which causes oxygen to bond to the surface of the pipeline thus causing corrosion.

FIG. 1 illustrates a first type of cathodic protection referred to as a galvanic cathodic protection. In the embodiment shown in FIG. 1, the galvanic protection scheme 14 include a pair of magnesium anodes 16 that are each connected to a portion of the pipeline 10 through a wire 18. The wire 18 provides a conduit fir electrons to flow from the negatively charged magnesium or zinc anode 16 to the outer surface 20 of the pipeline 10. The pipeline 10 acts as a cathode since the pipeline is more positively charged than the anode 16. The polarization on the steel of the pipeline 10 will attract positive ions from the soil, thereby halting corrosion of the steel. An important characteristic that must be monitored to insure that corrosion is not taking, place is the voltage on the surface of the pipeline 10. In the embodiment shown in FIG. 1, a voltage detection device 22 is connected to the surface of the pipe through a wire 24 and acts as a test point for the pipeline. By monitoring, the voltage on the surface of the pipe through the voltage detection device 22, the utility can insure that the anodes 16 have not become depleted and their protection eliminated.

In one embodiment of the system shown in FIG. 1, the connection between the anode and the cathode results in electronic flow, causing the iron pipeline to become polarized and changes its voltage to around the mid-point of the natural galvanic, voltage of the two materials.

As an example, the natural galvanic voltage of magnesium is −2.3 volts while the natural ionic galvanic voltage of iron is −0.44 volts. The average between these two voltages is around −0.95 volts. Experts in the field have determined that a cathode with a negative charge of −0.85 volts or more negative is understood to be effectively protected against corrosion. Thus, the voltage of the pipe is tested at multiple locations along the pipeline utilizing the voltage detection device 22 to insure that the surface of the pipeline 10 is at least −0.85 volts insures that the pipeline is not undergoing corrosion.

Test points such as illustrated by the voltage detection device 22, are located at spaced geographic locations along the pipeline 10. In some utility pipeline systems, there may be over 100,000 geographically dispersed test points that must be manually surveyed at least once per year.

Figure 2:
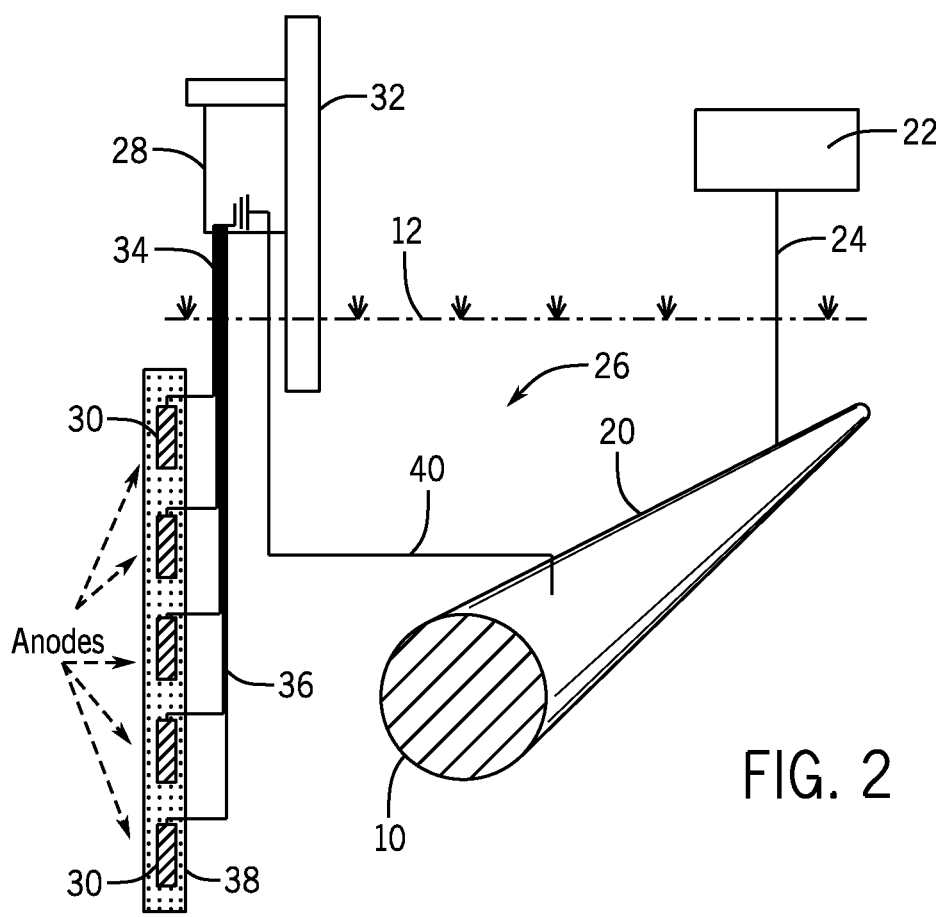
FIG. 2 is a schematic illustration showing the element of an impressed current protection cathodic protection scheme.

FIG. 2 illustrates a second type of cathodic protection system, which will be referred to as the impressed current protection system and shown in FIG. 2 by reference numeral 26. In the impressed current protection system 26, a rectifier 28 is positioned between the pipeline 10 and a series of joined anodes 30. The rectifier 28 is connected to a utility power supply 32 and forces electron flow to the gas pipeline 10 to halt corrosion of the steel. In this system, the AC powered rectifier 28 converts AC voltage to DC. The rectifier 28 typically has a maximum DC output of between 10-50 amps and 50 volts. Many gas utilities limit the amount of impressed current to not more than 40 amps due to safety considerations.

The positive DC output terminal 34 is connected by a series of cables 36 to an array 38 of anodes 30 buried in the ground. The anodes 30 are typically non-active metal or compounds, such as platinum, graphite, high silicon iron or other similar materials. Another cable 40 is connected to the negative terminal of the rectifier and extends to the outer surface 20 of the pipeline 10. Since electrons flow from negative to positive, the rectifier circuit will cause electrons to flow from the anode strip 38 through the circuit in the rectifier 28 to the pipeline 10. At the time the system 26 is installed, the protection voltage output from the rectifier 28 is adjusted to an optimal level and recorded for reference.

The rectifier 28 also falls within the guidelines of the U.S. Department of Transportation and must be tested once every two months.

In addition to the rectifier 28, multiple test points, which each include the voltage detection device 22, are also positioned along the length of the pipeline near the rectifier 28. The voltage measurement taken at the test point, as in the embodiment of FIG. 1, needs to be monitored and recorded at least once a year.

FIG. 3 illustrates a cathodic protection system 42 constructed in accordance with the present disclosure. The cathodic protection system 42 includes a plurality of test points 44 that are geographically dispersed along with a plurality of rectifiers 28 that are also each geographically dispersed. In the embodiment shown in FIG. 3, each of the test points 44 includes a terminal block 46 that provides electrical connections to the pipeline 10 and the protection system. The terminal block 46 is in turn connected to a test point monitor 48 that includes an internal, battery powered transmitter that transmits information through an antenna 50. The information sent from each of the test point monitors 48 can be communicated utilizing various different types of communication protocols, such as but not limited to the FlexNet® communication protocol available from Sensus Metering. The test point monitor 48 can both transmit and receive information and can record information related to the section of pipeline 10 and communicate this information on an automated basis.

Presently, multiple different types of physical configurations and terminal blocks 46 exist for measuring the voltage on the surface of the pipeline 10. As an example, the terminal block 46 can be used with a two wire test point, a three wire test point, a four wire test point, a critical bond test point, a casing test point, or a current drop test point. Each of these different terminal blocks utilizes a different configuration obtaining the voltage from the surface of the pipeline 10.

The test point monitor 48 includes a control unit that includes internal firmware that can be configured to interact with each of the different types of terminal blocks 46. At the time each of the test point monitors 48 are installed at the test points 44, the internal firmware contained within the test point monitor 48 is configured depending upon the type of terminal block 46. Based upon the instructions to the firmware, the test point monitor 48 will calculate a voltage that is present on the surface of the pipeline 10, which is then relayed utilizing the antenna 50 and communication protocol.

As further shown in FIG. 3, the rectifier 28 is connected to a rectifier controller 49 having an antenna 50. In this manner, the rectifier 28 can both receive and transmit information related to the operational status of the rectifier 28.

The rectifier controller 49 connected to the rectifier 28 also includes a control unit that includes firmware that allows the rectifier controller 49 to control operation of the internal circuitry contained within the rectifier 28 connected to the utility power supply 32. As an illustrative example, the firmware will be able to disconnect the application of the protection voltage to the surface of the pipeline at desired intervals based upon communication signals received at the rectifier controller 49. Various other operational sequences can be carried out by the control unit of the rectifier controller 49 utilizing the communication control signals received by the rectifier controller 49 through the antenna 50.

As shown in FIG. 3, the cathodic protection system 42 includes a base station 52 that is able to wirelessly communicate to the plurality of dispersed test point monitors 48 and rectifier controllers 49. The base station 52 can be positioned at a location that can communicate with a maxim urn number of test point monitors 48 and rectifier controllers 49. Multiple base stations 52 can be utilized when the geographic dispersion of the test point monitors 48 and rectifier controllers 49 is great enough such that a single base station 52 cannot communicate to all of the test point monitors 48 and rectifier controllers 49. As described above, the FlexNet communication protocol allows for the communication between the base station 52 and a plurality of dispersed test point monitors 48 and rectifier controllers 49.

The base station 52, in turn, communicate with one or more back end servers 54 utilizing either a hardwired or wireless communication technique. The back end servers 54 process information received from the plurality of s test point monitors 48 and rectifier controllers 49. The back end servers 54 include databases that compile information received from the test point monitors 48 and rectifier controllers 49 and are able to present the information to an operator utilizing a solution management application 56, such as is shown on the display screen 58. The solution management application 56 allows one or more operators to view the information compiled by the back end servers 54 and to send commands out to the individual test points 44 and rectifiers 28 through the test point monitors 48 and rectifier controllers 49 as will be described in much greater detail below. The solution management application 56 provides a software application that is able to collect and display data and provide analytics to identify and resolve system issues without requiring service personnel to manually read the information at each of the test points 44 and rectifiers 28.

Figure 4A:
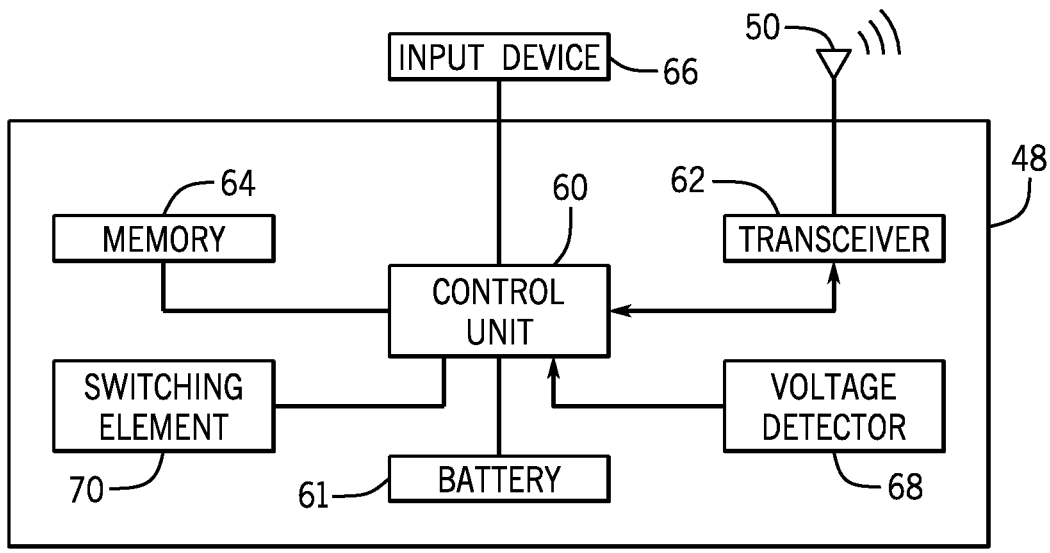
FIG. 4A is a schematic illustration of one of the test point monitors utilized in the system of the present disclosure.
Figure 4B:
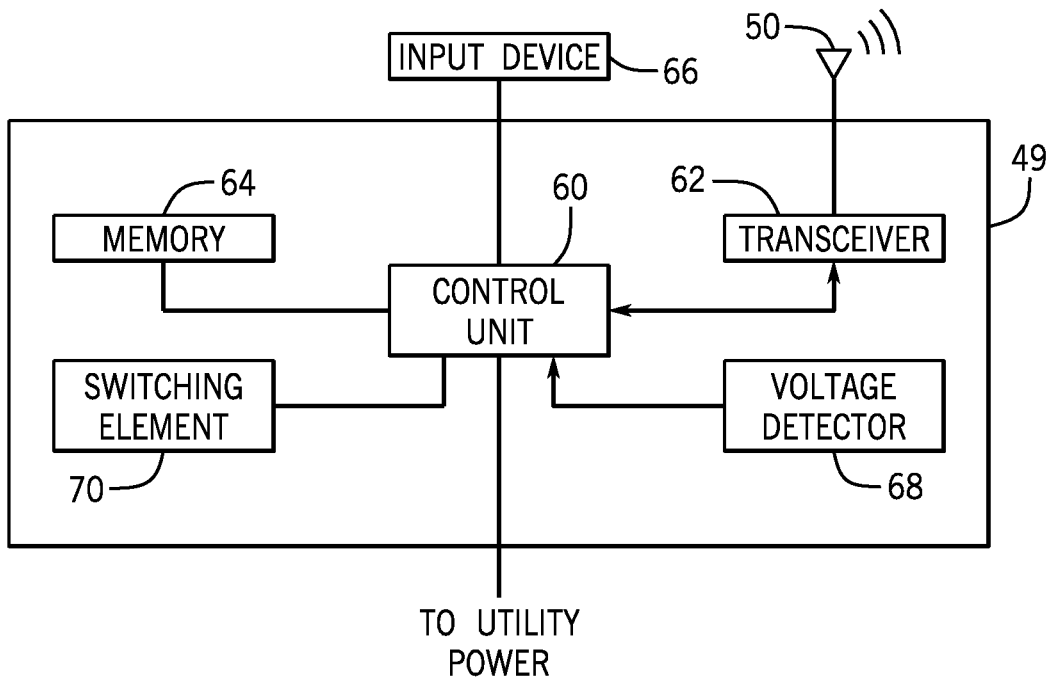
FIG. 4B is a schematic illustration of one of the rectifier controllers utilized in the system of the present disclosure.

FIG. 4A illustrates one schematic embodiment of the test point monitor 48 that is used to communicate between each of the test points 44 and the base station 54. FIG. 4B illustrates one embodiment of the rectifier controller 49 that is used to communicate between the rectifiers 28 and the base station 54.

Each of the test point monitors 48 and rectifier controllers 49 includes a control unit 60 that controls the operation of the associated device. The control unit 60 includes internal firmware that controls the configuration of the test point monitor 48 when the test point monitor 48 is used with one of the test points. The control unit 60 controls the operation of a rectifier through the associated rectifier controller. The control unit 60 is coupled to a battery 61 that provides power for all of the components contained within the test point monitor 48 or rectifier controller 49. It is contemplated that the battery 61 will be easily replaceable and will provide an indication to the control unit 60 when the battery 61 begins to reach a discharge threshold. Upon reaching the threshold, the control unit 60 will signal that the battery 61 needs to be replaced by service technicians.

Since the rectifier controller 49 is installed at a location to monitor a rectifier connected to a utility power supply, the battery 61 can be eliminated since a supply of utility power can be used for powering the internal components of the rectifier controller 49. In other embodiments and applications where utility power is not available, the battery 61 will power the internal components of the either the test point monitor 48 or the rectifier controller 49.

The control unit 60 is coupled to a transceiver 62 that is able to both transmit and receive information from the antenna 50. The control unit 60 is coupled to a memory device 64 that allows the control unit 60 to both store information and retrieve stored operational parameters entered into the device from a user input device 66. The control unit 60 receives information from a voltage detector 68 and is coupled to a switching element 70. The switching element 70 allows the control unit 60 to interrupt current flow, and thus the application of the protection voltage, from a rectifier to the pipeline in a manner that will be described in much greater detail below.

During the initial setup of the test point monitor 48, a service technician can configure the test point monitor 48 to take system readings with respect to the pipeline at a selected interval, such as on an hourly basis or once per day, or upon a received command. In addition, the firmware of the test point monitor 48 can be configured to interact with the different physical configurations of the test points that are available and were described above. In this manner, the firmware is able to configure the test point monitor or the various different types of test points. The control unit 60 can further receive information from the transceiver 62 regarding the signal-to-noise ratio of communication from the transceiver 62 and can tailor operation accordingly.

When the test point monitors 48 and rectifier controllers 49 are initially installed, the GPS coordinates of the installation are entered into the control unit 60 through the input device 66 and stored in the memory 64. Alternatively, the test point monitors 48 and rectifier controllers 49 can include an internal GPS device and can record this information automatically.

In addition to this information, the technician also provides information to the control unit 60 as to the type of system-specific application for which the test point monitors 48 and rectifier controllers 49 are being used. As an example, the test point monitor 48 may be used as part of a galvanic protection test point or an impressed current test point. Thus, when the control unit 60 sends signals through the transceiver 62, the base station and associated back end servers can determine the type of application for which the test point monitor is being utilized.

In addition to this information, a technician can enter coarse and fine voltage sensors in the rectifier controller 49, depending on the configuration of the rectifier 28.

In addition, the type of protection scheme being utilized at the test point can be entered into the firmware of the test point monitor. As will be described below, multiple different types of protection schemes can be utilized, such as a two-wire protection, three-wire protection, two-wire protection with a one-wire coupon, critical bond protection or casing protection.

Through the transceiver 62, the control unit 60 can receive information from the solution management application software such that the configuration and settings of the control unit 60 can be adjusted. For example, the controller reading threshold and frequency can be adjusted through automatic, signals received by the transceiver 62.

According to one embodiment of the disclosure, the rectifier controller 49 shown in FIG. 4B includes a voltage detector 68 that can measure and record both single phase and three phase input AC voltage, DC voltage up to 50 volts, DC current up to 50 amps.

Figure 5:
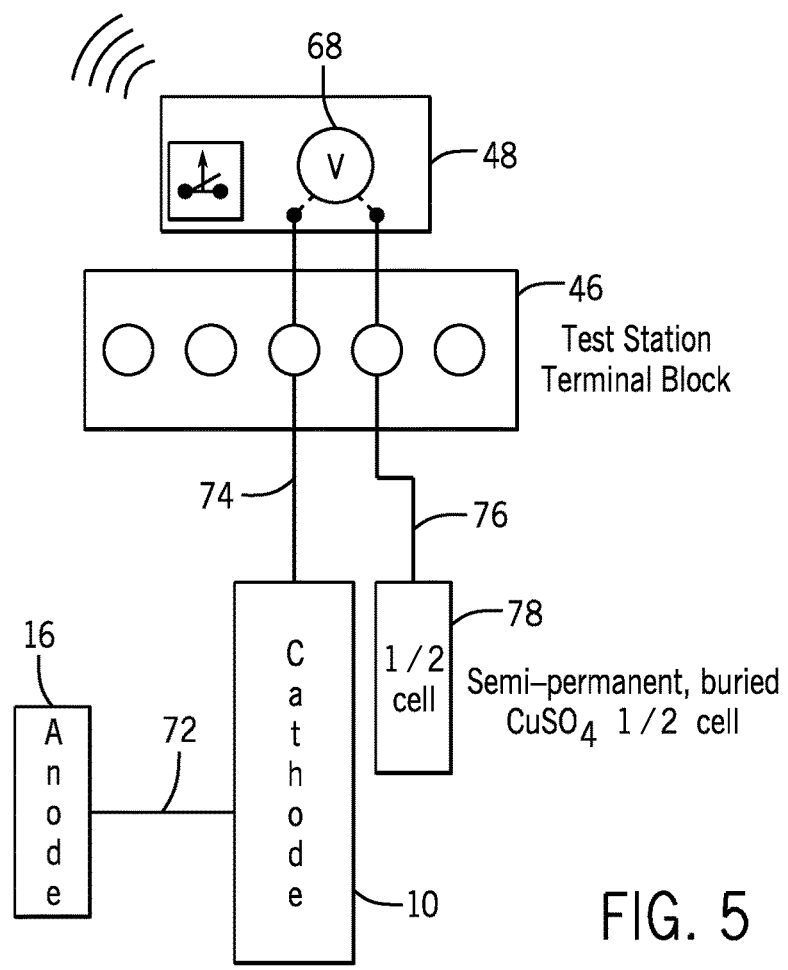
FIG. 5 illustrates a two-wire galvanic protection system.

FIG. 5 illustrates one type of galvanic protection arrangement utilized by utilities. In the embodiment shown in FIG. 5, the test point monitor 48 is shown coupled to the test station terminal block 46, which is in turn coupled to a two-wire galvanic protection system. In this embodiment, a cable 72 is connected directly from the anode 16 to the pipeline 10. In this case, charge is always present on the pipeline 10. When configured a shown, two wires are presented to the test station terminal block 46, namely a first wire 74 from the cathode and a second wire 76 from a reference half-cell 78. In this arrangement, the only meaningful data that can be extricated will be the potential difference between the pipeline 10 and the reference half-cell 78. The voltage detector 68 in a test point monitor 48 detects this voltage difference. In the embodiment shown, the test point monitor 48 can terminate both connections and measure the voltage of the pipeline 10 relative to the half-cell 78.

Figure 6:
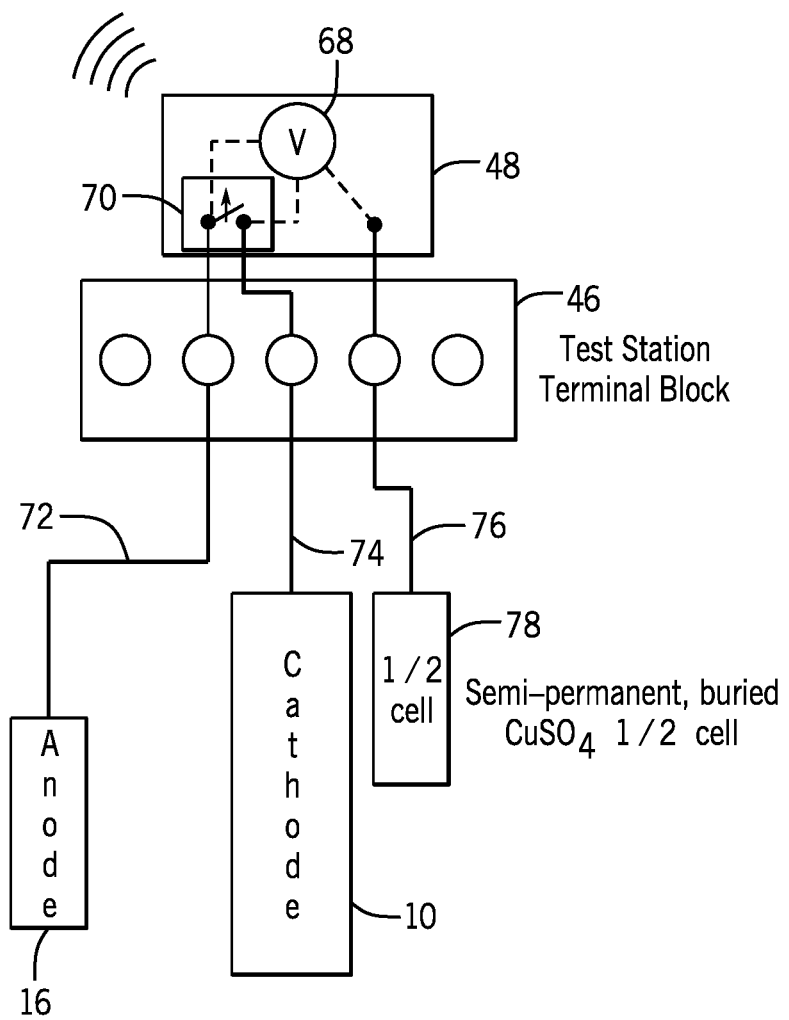
FIG. 6 illustrates a three-wire galvanic protection system.

FIG. 6 illustrates another protection arrangement referred to as the three-wire galvanic protection arrangement. In this embodiment, three wires are presented at the test station terminal block 46. A first wire 72 is connected directly to the anode 16, a second wire 74 is connected to the cathode pipeline 10 while the third wire 76 is connected to the half-cell 78. The internal firmware of the test point monitor 48 and switching element 70 allows the test point monitor 48 to connect the anode 16 to the cathode (pipeline) 10 during normal operating conditions. During testing procedures, the test point monitor 48 can move the switching element 70 and the voltage detector 68 can be used to detect the voltage difference between the pipeline 10 and the half-cell 78. The switching element 70 allows the test point monitor 48 to have the ability to terminate all three wires and interrupt the flow of electrons from the anode to the cathode. In this manner, the test point monitor 48 can measure both the potential difference between the anode and the reference half-cell as well as the difference between the unprotected pipe and the reference half-cell.

Figure 7:
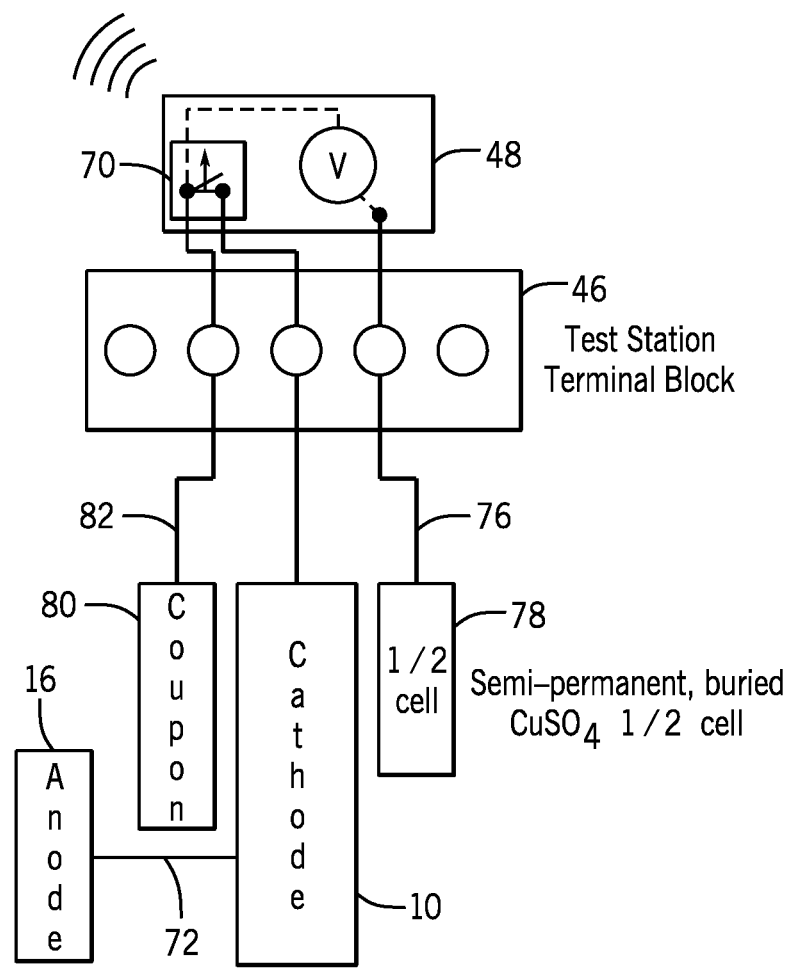
FIG. 7 illustrates a two-wire galvanic protection system including a one-wire coupon.

FIG. 7 illustrates yet another galvanic protection arrangement that is referred to as two-wire galvanic protection with one-wire coupon. In this embodiment, the anode 16 is connected directly to the pipeline 10 through the wire 72. The half-cell 78 is connected to the terminal block 46 through the wire 76.

Many utilities have become concerned that federal regulations may change, thereby forcing utilities to augment standard galvanic system on testing with instant off testing that is currently used with impressed current methods. In order to do this, the utility will bury a coupon 80 with similar material characteristics as the pipeline 10 in close proximity to the pipe. The coupon 80 will be connected to the pipe which is always being charged by the anode. The coupon 80 is shown having a wire 82 extending to the terminal block and ultimately to the switching element 70. This connection will cause the coupon 80 to achieve the same voltage as the connected system.

When configured as shown in FIG. 7, the current supply to the coupon 80 can be interrupted by the test point monitor 48, thereby allowing an instant off voltage to be measured between the coupon and the reference half-cell 78. The test point monitor 48, through the switching element 70, has the ability to terminate all three wires and provide an interruptible continuity between the coupon 80 and the pipeline 10. The test point monitor 48 can break the coupon to pipe connection and with a fifty millisecond delay, measure the potential difference between the coupon and the reference half-cell.

Figure 8:
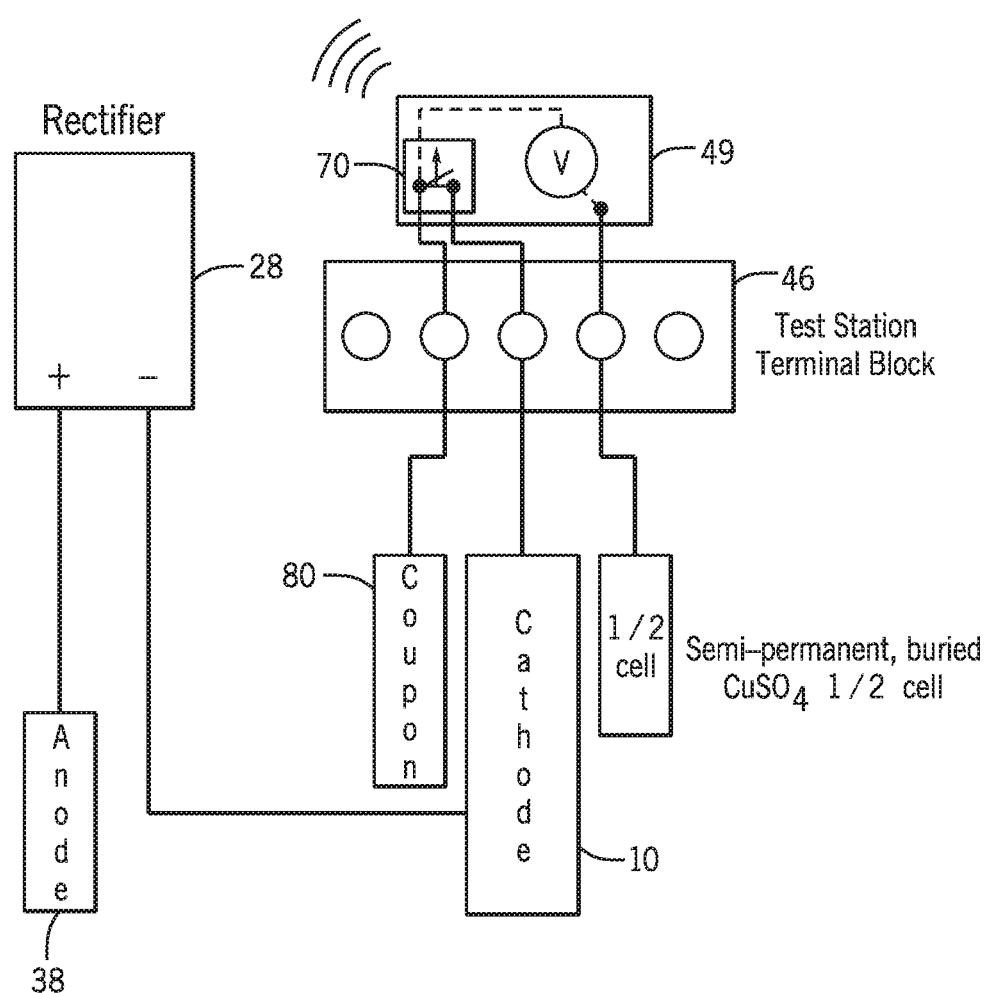
FIG. 8 illustrates a two-wire impressed current protection system including a one-wire coupon.

FIG. 8 illustrates a two-wire impressed current protection schematic that includes a coupon 80. In the embodiment shown in FIG. 8, the rectifier 28 is positioned between the anode array 38 and the pipeline 10 that forms the cathode. The test point monitor 48 that forms part of the test point is connected to the terminal block. The embodiment shown in FIG. 8 is similar to the embodiment of FIG. 7 except that the rectifier 28 is positioned between the anode and the pipeline 10.

Although not shown in the drawing Figures, in situations in which the pipeline is routed under a roadway or another area with significant load, utilities encase the area of the pipe subject to the load. In such a situation, the protective casing is electrically isolated from the other portions of the pipe. Over time, loads can shift the orientation of the casing with the potential to create a short between the outer casing and the pipeline. Such a situation would have the effect of causing the pipe to become unprotected by the cathodic protection system.

In this scenario, two wires can be presented at the terminal block one from the pipe and the other from the grounded casing. The voltage potential between these two sources should be more negative than −0.850 volts in such an embodiment, the smart gateway can thus determine whether or not the outer protective covering is shorted and send a signal to alert the utility.

Referring back to FIG. 3, the rectifier controller 49 associated with each of the rectifiers 28 is able to perform multiple different functions and obtain multiple different types of readings related to the operation of the rectifier 28. For example, the rectifier controller 49 can measure the AC input voltage to the rectifies 28 from the utility power source 32, the DC output from the rectifier 28 to the pipeline 10, as well as the DC current to the pipeline.

When an operator is viewing the solution management application 56 on the display 58, the operator may receive an alarm that indicates a low DC current threshold alarm has been detected. The low DC current threshold alarm indicates that the value of DC current flowing to the pipeline 10 is below a threshold value. In order to troubleshoot this alarm situation, an operator issues a command to obtain all of the critical metrics from the rectifier 28 that is generating the alarm condition. Based upon this information, the operator may determine that the AC voltage input is 120 volts while the DC output voltage and the DC current output are 0. Such readings indicate that the rectifier is receiving AC power from the utility but that the rectifier is not operating properly to supply the required current and voltage to the pipeline. In such an instance, the technician can send out a repair team to replace or repair the troubled rectifier.

Figure 9:
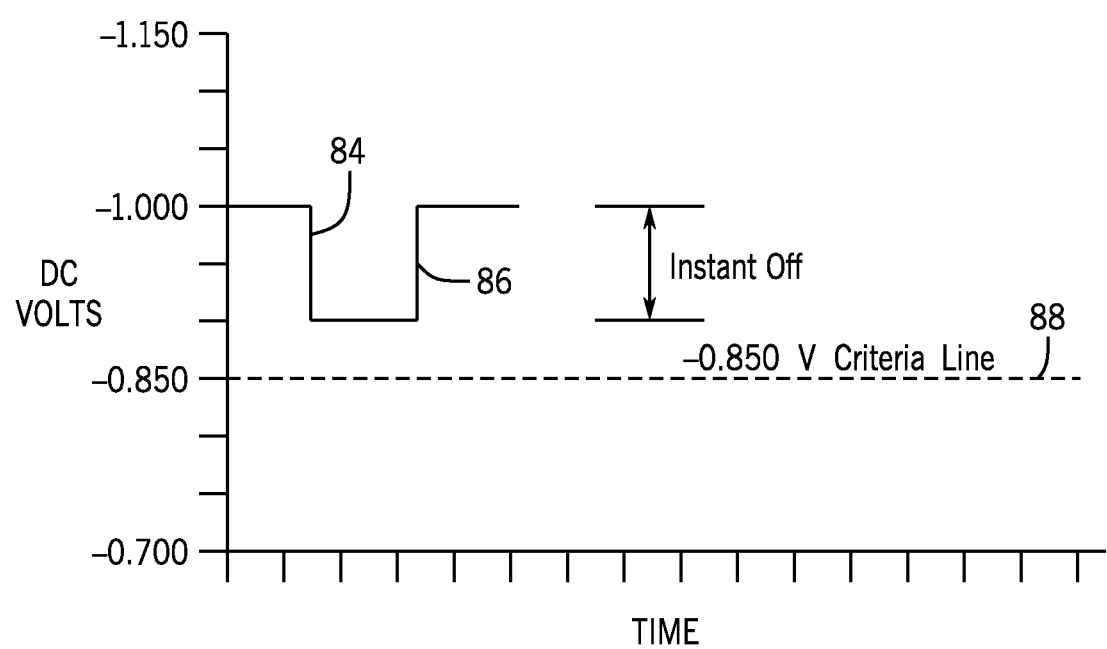
FIG. 9 presents a graphic illustration of an off testing procedure.

In addition to this alarm situation, the system of the present disclosure allows the utility to execute various different testing procedures for the rectifier. One such procedure is referred to as a PSP2:off testing procedure. In this procedure, the DC current flowing from the rectifier to the pipeline is interrupted utilizing the switching device shown in FIG. 4. As shown in FIG. 9, the interruption in DC current is shown by the transition 84. After this interruption, each test point was given a specific time to collect voltage readings that occur 0.5 seconds after the current flow is interrupted. After these measurements are taken, power is restored to the pipe section, which is shown by the transition 86 in FIG. 9. During this interruption in the current to the pipeline, the system determines whether or not each of the test point returns a reading that is above the 850 critical voltage line 88 shown in FIG. 9. In this manner, the system is able to test the voltage on the pipeline at each of the test points following interruption to the current flow from the anode to the cathode.

In order to carry out the procedure described above, the rectifier controller 49 associated with the rectifier and the associated test point monitors 48 associated with each of the test points must be time synchronized. In accordance with one aspect of the present disclosure, each of the test point monitors 48 and rectifier controllers 49 associated with either the test points or the rectifier receives a common time synchronization signal. The time synchronization signal is tied to either a signal from the back end server or from a common GPS clock. Since the test point monitors 48 for the test points and the rectifier controllers 49 for the rectifiers are connected to the same network, the time synchronization between the rectifiers and the test points can be coordinated. Such coordination was not available in prior art systems.

As an indicative example, a rectifier 28 may provide current and thus a protection voltage to the pipeline 10 shown in FIG. 3. The pipeline 10 may include a large number of test points, such as twenty test points, spaced over a distance, such as five miles, in order to carry out the test procedure shown in FIG. 9, the rectifier controller 49 interrupts the current flow and thus application of the protection voltage to the surface of the pipeline. Since each of the test point monitors and rectifier controllers are synchronized with each other, the test point monitor at each test point can be coordinated to collect a voltage reading, that occurs 0.5 seconds after the current flow is interrupted at the rectifier. This voltage measurement is saved and relayed back to the back end server 54 for analysis utilizing the management application software 56 shown in FIG. 3.

Figure 10:
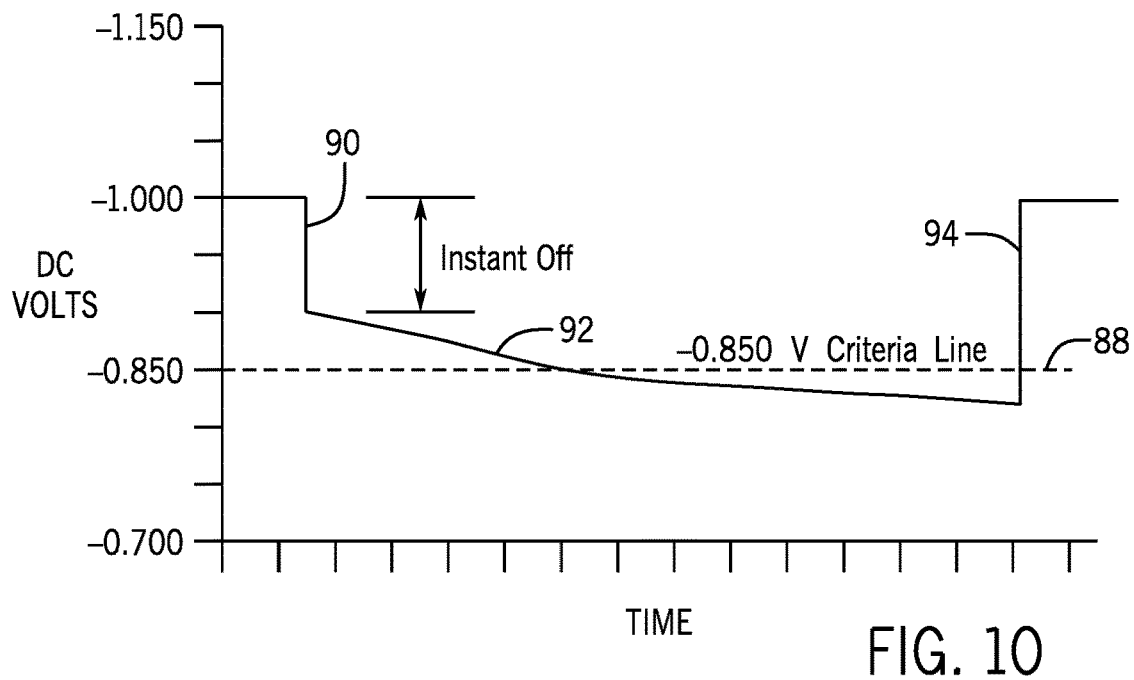
FIG. 10 provides a graphic illustration of the decay in the pipeline voltage upon discontinuance of the impressed galvanic protection system.

FIG. 10 indicates the result of another type of testing procedure that can be implemented utilizing the system of the present disclosure. According to utility schedules, an operator executes a 100 millivolt polarization test. During this test, the DC current is interrupted to all of the rectifiers associated with a pipe section that is being tested. After interruption, the system records hourly voltage reading from each of the test points associated with the pipe section under the testing procedure. In order to determine the results of the tests, the application software calculates the difference between the last "on" voltage measure prior to the test and the last "off" voltage taken during the testing procedure. If the absolute value of the difference was greater than or equal to 100 millivolts for a test point, the test point passed. Otherwise, the test point failed. FIG. 10 illustrates the decrease in the voltage value on the pipeline following the instant off shown at point 90. As illustrated in FIG. 10, the voltage 92 drops below the critical voltage line 88 and again exceeds the critical line when the rectifier is again activated, as illustrated by the portion 94 of the voltage signature.

As can be understood in the test procedure shown in FIGS. 9 and 10, the system application software is able to run a multitude of different testing procedures based upon the time synchronization between the test point monitors and rectifier controllers and the ability to communicate to the test point monitors associated with each of the test points 44 and the rectifier controllers associated with each of the rectifiers 28. The two-way communication between the application software and each of the test point monitors 48 and rectifier controllers 49 allows the operator to test the functionality of the rectifiers and test points at regularly designed intervals or at user defined points in time.

As described with reference to FIG. 3, part of the cathodic protection application 42 is the solution management application 56 that operates on the back end servers 54 and is presented on the display 58. The solution management application 56 will be shown and described with reference to FIGS. 11-25.

Figure 11:
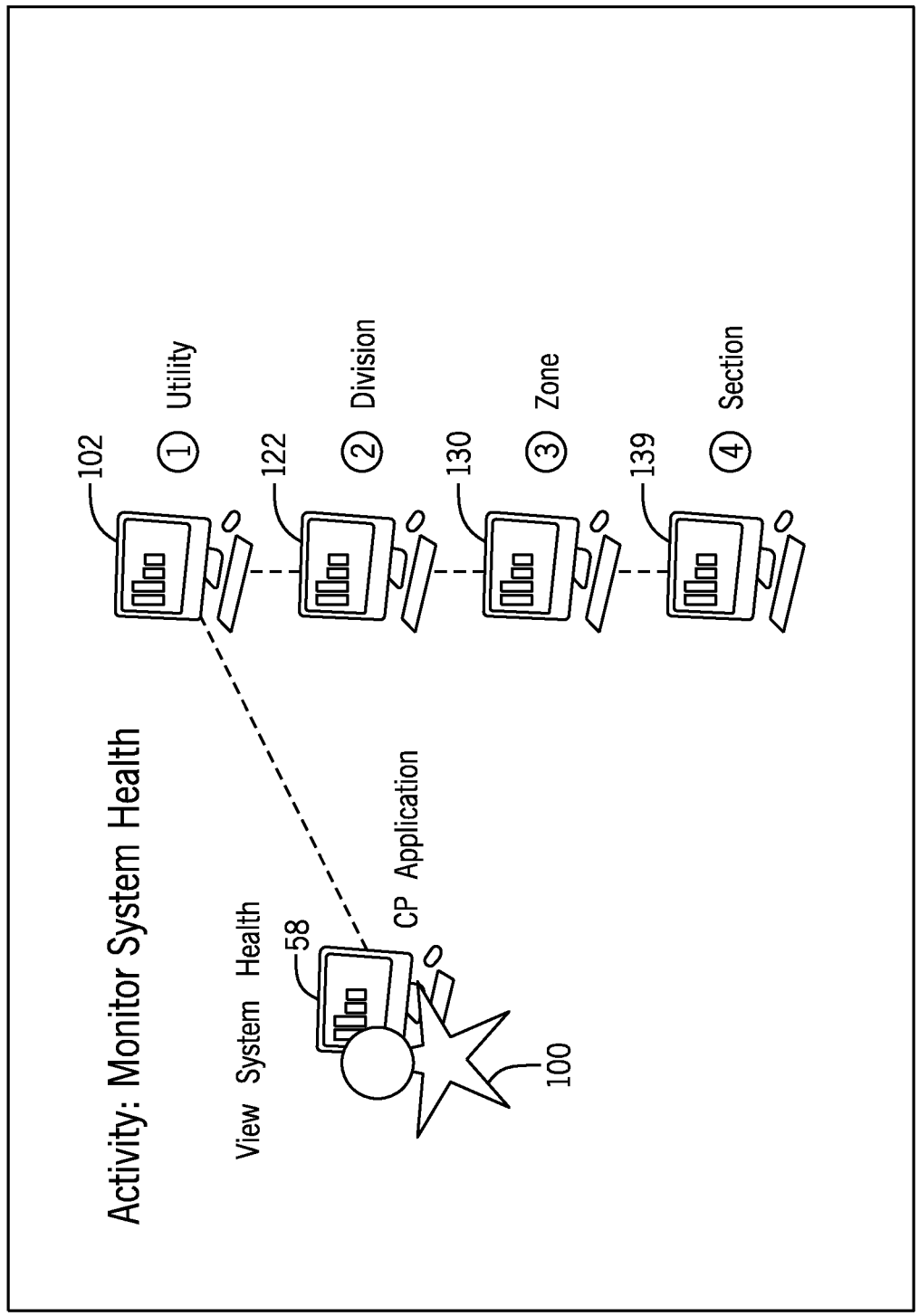
FIG. 11 is a sample illustration of one mode of operation for the solution management application.
Figure 12:
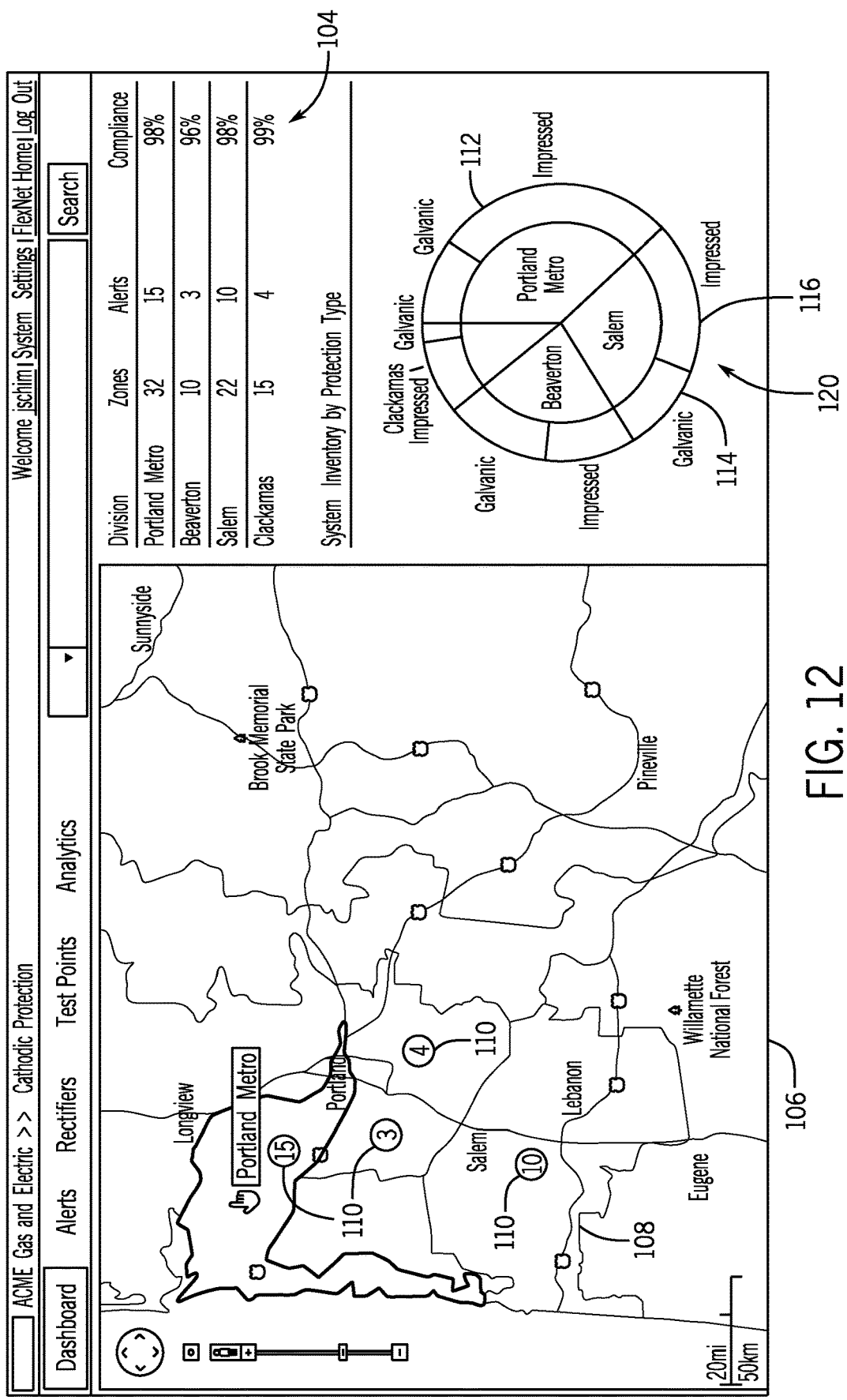
FIG. 12 is a screen display at the utility level.

FIG. 11 schematically illustrates a first function of the solution management application, which is the ability to monitor the entire system health. As shown in FIG. 11, an operator 100 viewing the display 58 is able to monitor the system health on four separate levels illustrated by reference numerals 102, 122, 130 and 139. At the top level 102, the dashboard allows the operator 100 to view the entire utility grid. The utility grid display screen is shown with more detail in FIG. 12. As shown in FIG. 12, the utility display screen is broken down into four separate divisions (Portland, Beaverton, Salem and Clackamas) which are shown in the display area 104. Although four separate divisions are shown, it should be understood that depending upon the utility, the number of divisions could be greater or fewer than four.

In the display area 104, the application software presents the operator with the listing of the four divisions, the number of zones in each division and the current number of alerts at a given time in each of the divisions. The map area 106 visually illustrates each of the divisions by a borderline 108. In each of the illustrated divisions, an indicator 110 shows the number of alerts taking place in the area.

In the display shown in FIG. 12, an information graphic 112 graphically displays the number of galvanic test points 114 and impressed circuit test points 116 within each of the separate divisions 120. In this manner, the operator can quickly view the breakdown of each of the divisions, the number of alerts in each division and the location of each division superimposed on a map.

Figure 13:
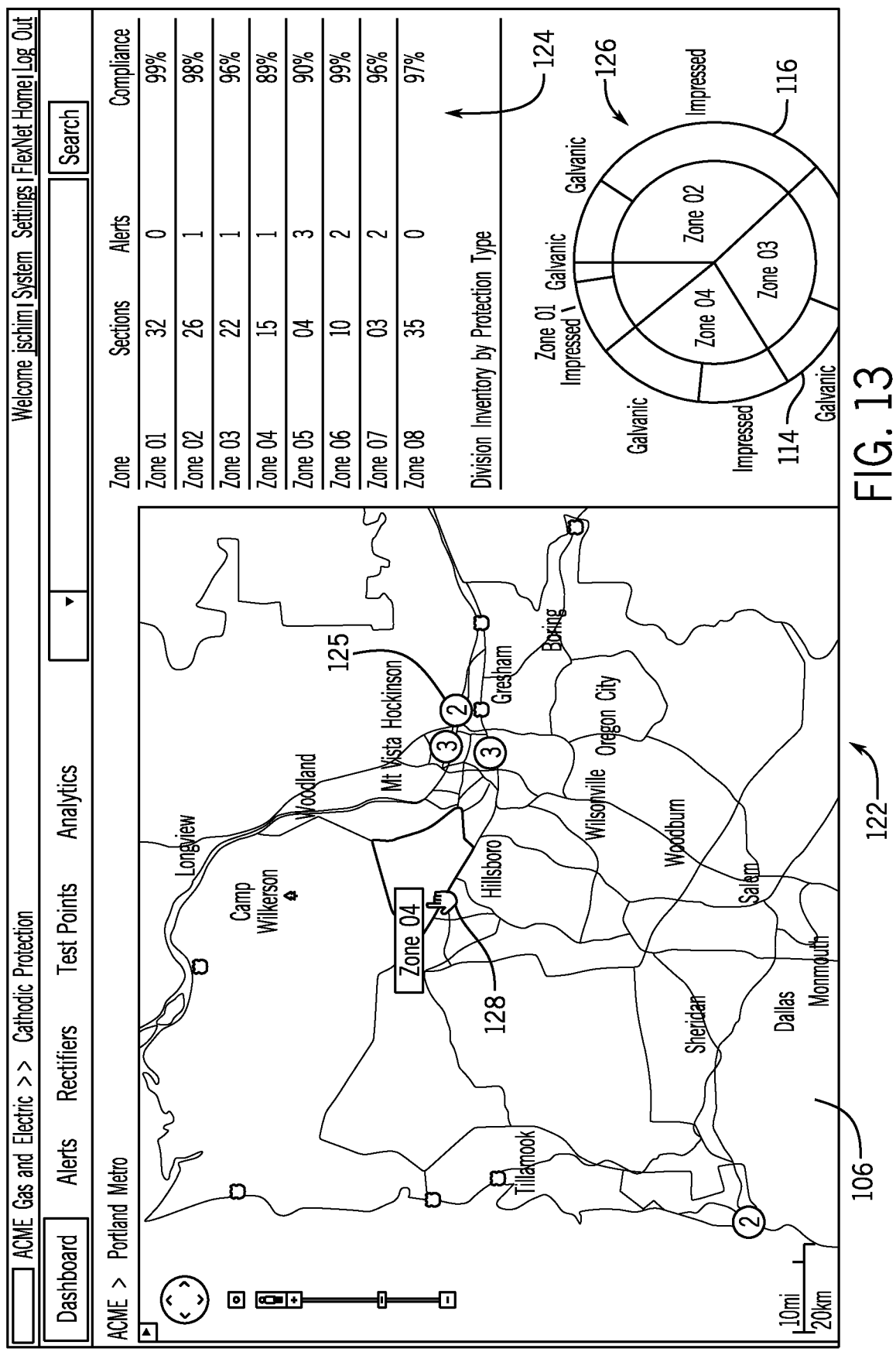
FIG. 13 is a screen display at the division level.

When a user selects one of the divisions, the user is directed to the display screen shown in FIG. 13. The division level display screen 122 includes a similar map area 106 that visually shows the division broken down into separate zones. The zones are listed and shown in display area 124 along with an indicator 125 showing the number of alerts in the zone. In the example shown in FIG. 13, the Portland Metro area includes eight zones. The informational graphic 126 shows the number of galvanic protection systems 114 and impressed current test points 116 on each of the zones. The display 122 shown in FIG. 13 further illustrates the breakdown of the test points in each of the zones.

Figure 14:
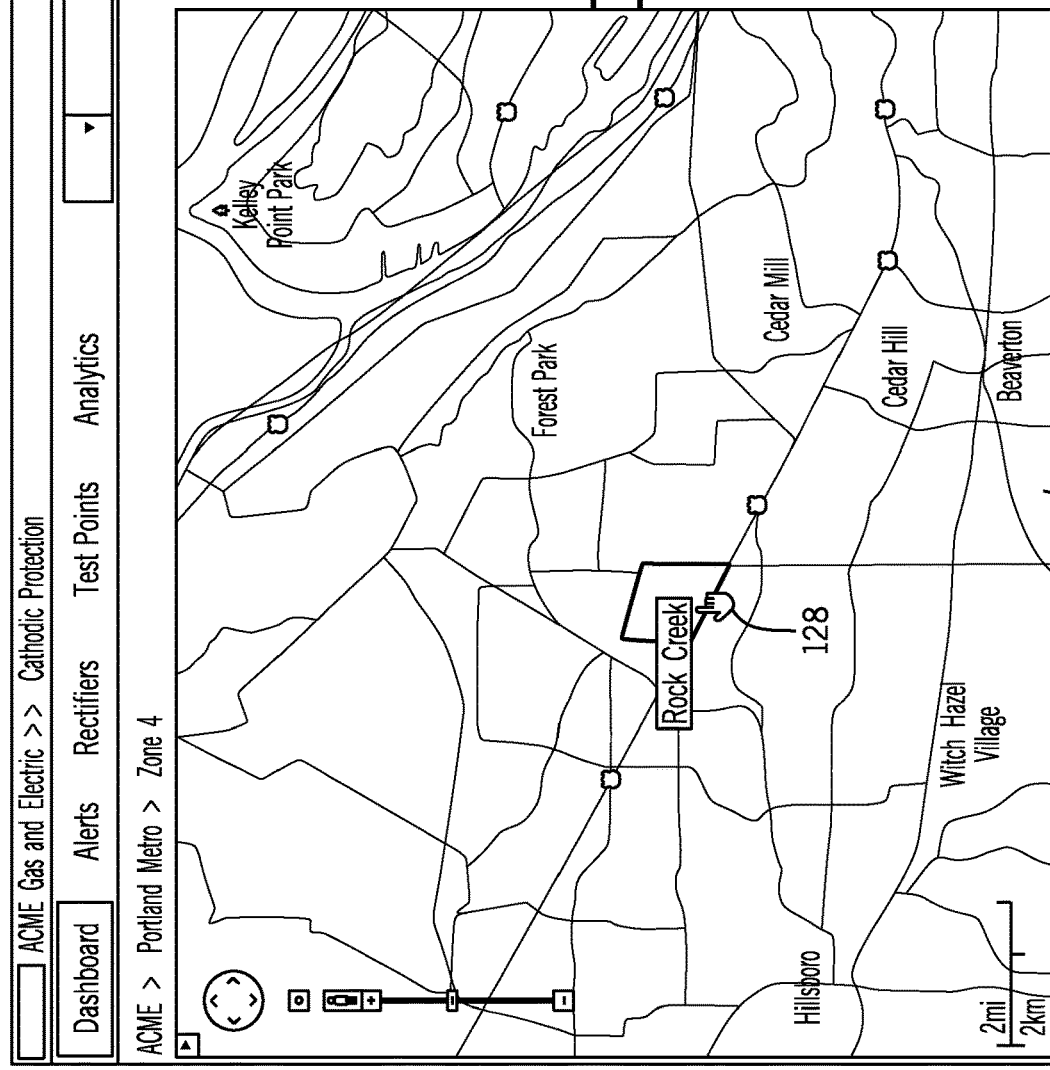
FIG. 14 is a screen display at the zone level.

If the operator selects zone 4, as indicated by cursor 128 in FIG. 13, the user is presented with another map in the zone display screen 130 of FIG. 14. The zone display 130 includes individual sections shown in the display area 132. Each zone section includes a rectifier display column 134 and a test point display column 136 that provide the number of each in each section. The alert column 138 quickly indicates to the operator the number of alerts in each of the sections. The highlighted section 140, labelled Rock Creek in the illustrative example, indicates that an alert is taking place in this section. The cursor 128 can be used to highlight this are of the map and, when selected, drills the user to the section display shown in FIG. 15.

Figure 15:
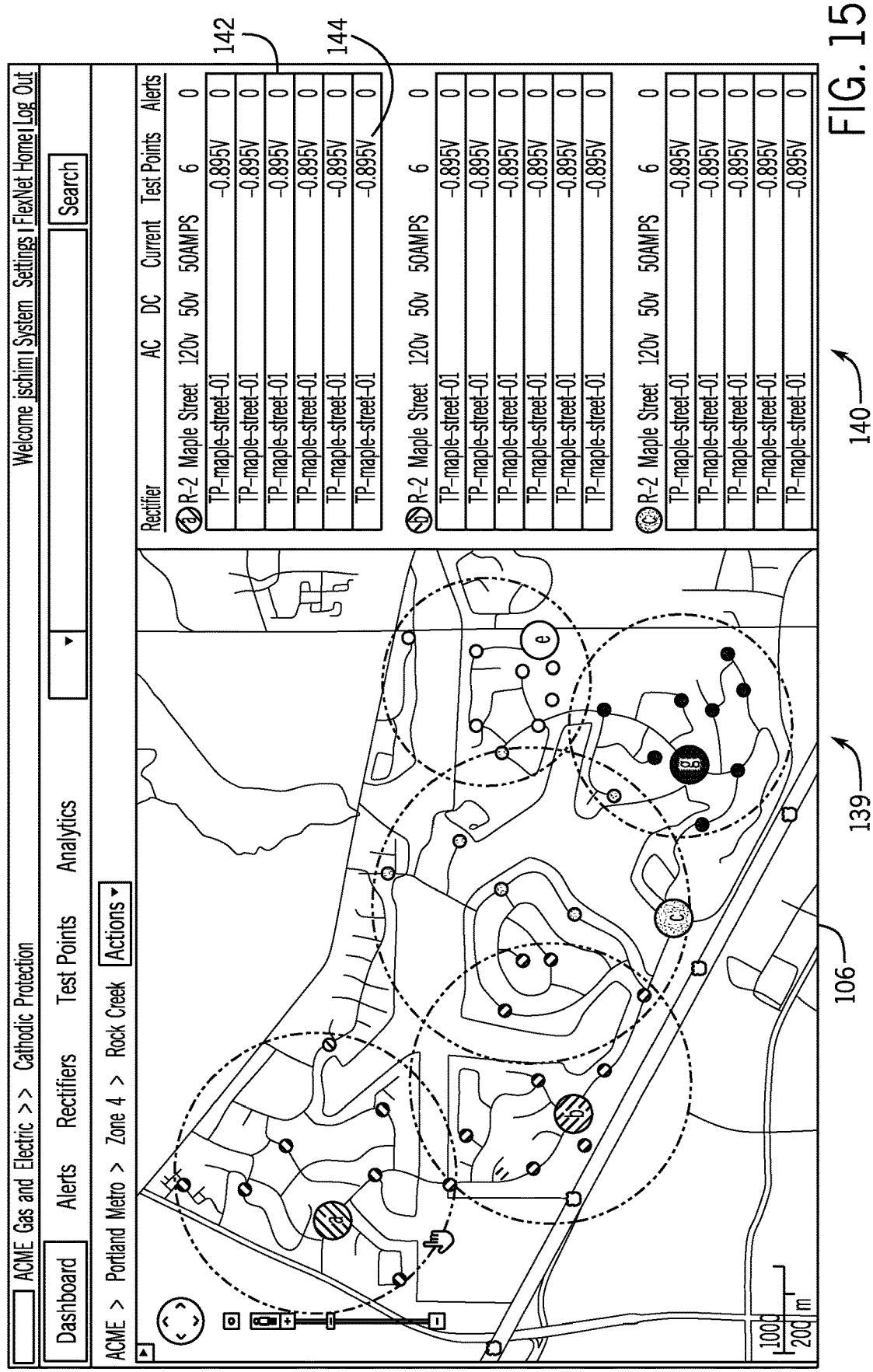
FIG. 15 is a screen display at the section level.

In FIG. 15, the operator is presented with a more detailed map 106 as well as a complete listing 140 showing each of the rectifiers within the specific zone. In the embodiment shown in FIG. 15, five rectifiers are illustrated and labelled with letters a-e. For the rectifier a, the AC voltage, DC voltage and current is displayed to the operator. Rectifier a has six test points, all of which are listed in the table section 142. The last reading for the voltage at the test point is displayed in column 144.

As can be understood in the drill down menus and displays shown in FIGS. 12-15, an operator can identify which test point may be generating an alarm by selecting more detailed areas of a map and, based up on this selection, identifying which test point in the utility's system is generating an alarm condition.

As described previously, each of the test points is able to communicate bi-directionally with the back end server through its own test point monitor 48. The back end server 54 accumulates this data and presents the data to the operator in a visually understandable manner that allows the operator to access data on demand from a centralized location.

Figure 16:
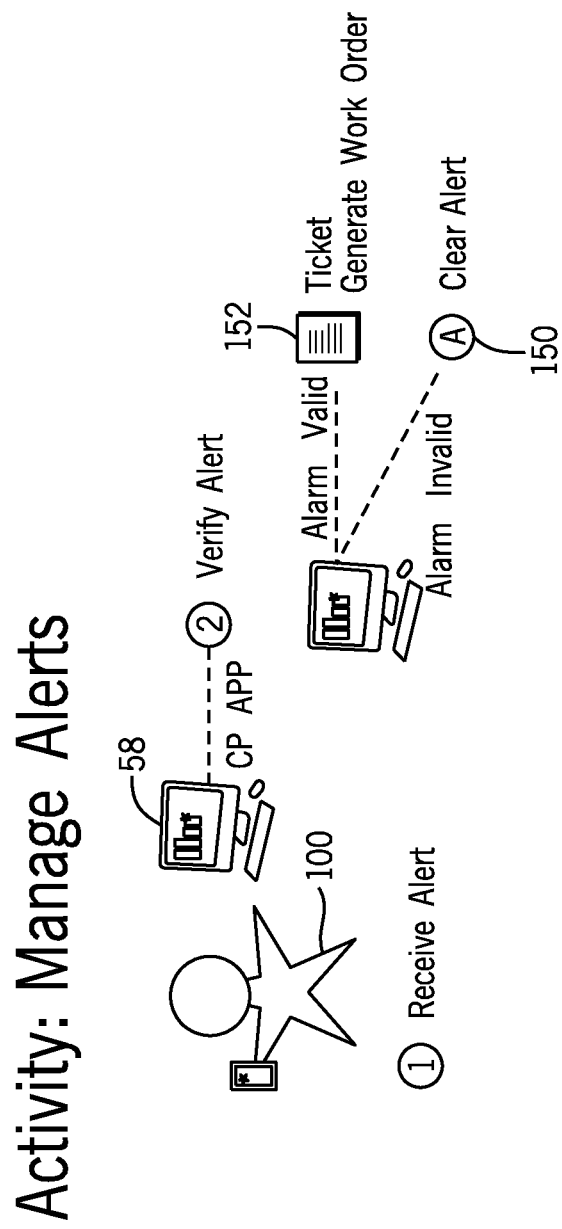
FIG. 16 illustrates the operation of the solution management software application in managing alerts.

In addition to monitoring system health, FIG. 16 illustrates that an operator 100 can manage alerts that are indicated on the display 58. The first step in this process is for the operator to verify if an alert has been generated and, based upon the reasoning behind the alert, either clear the alert as shown by step 150 or generate a work order shown by step 152.

FIG. 17 illustrates an alert display screen 154 indicating all of the alerts taking place across the utility network. Each of the alerts is identified by a textual identifier 156 as well as a visual display 158. The visual display 158 is color coded and indicates whether the alert is new, old and requires follow-up, or has been cleared. Each line on the display 154 indicates the location of the alert, which pipeline section the alert occurred, what type of device is generating the alert and the type of protection the device is providing. Column 160 shows the last value read at the device generating the alert. An action button 162 gives the operator a series of functions the operator can select based upon the alert.

Figure 18:
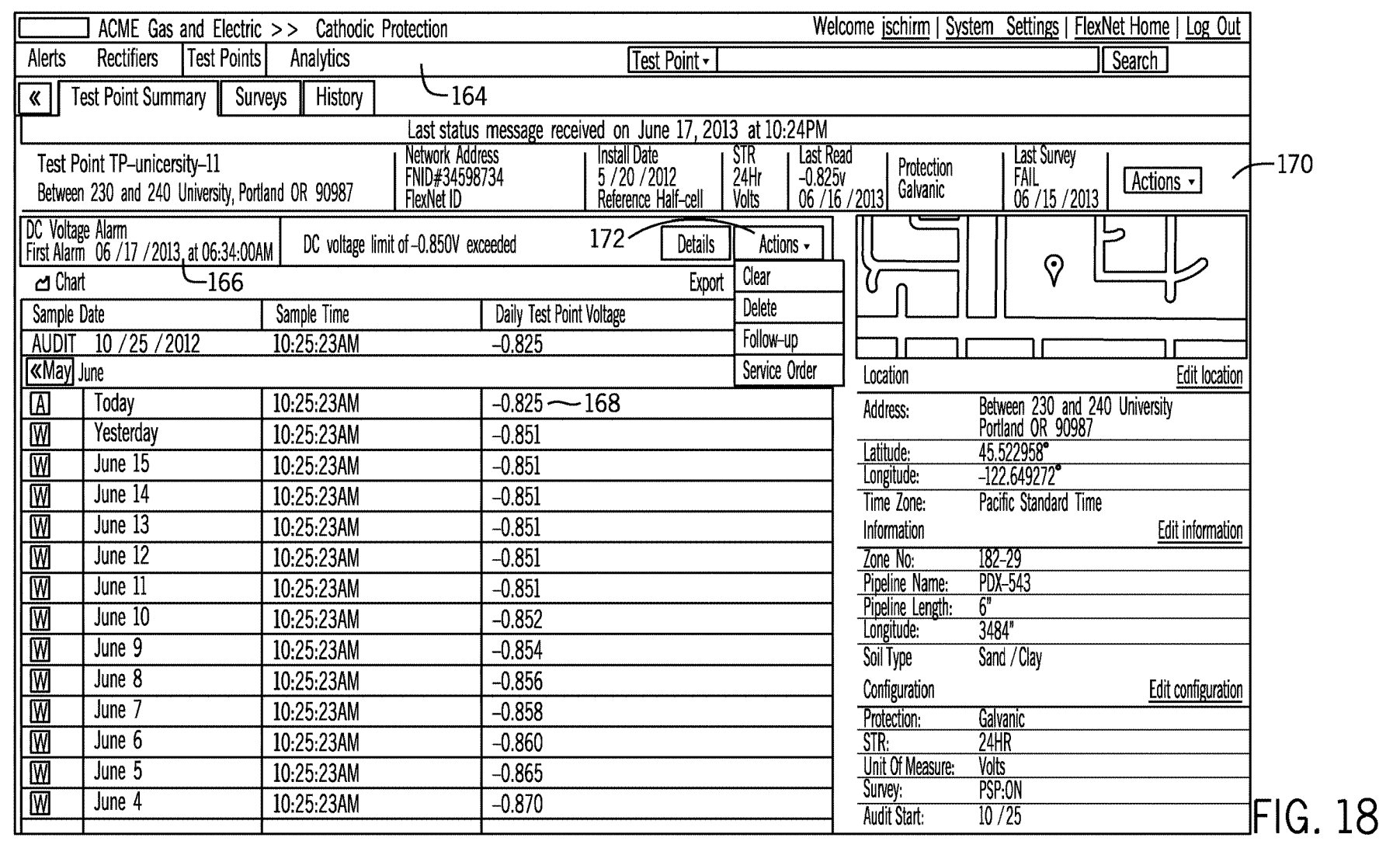
Figure 19:
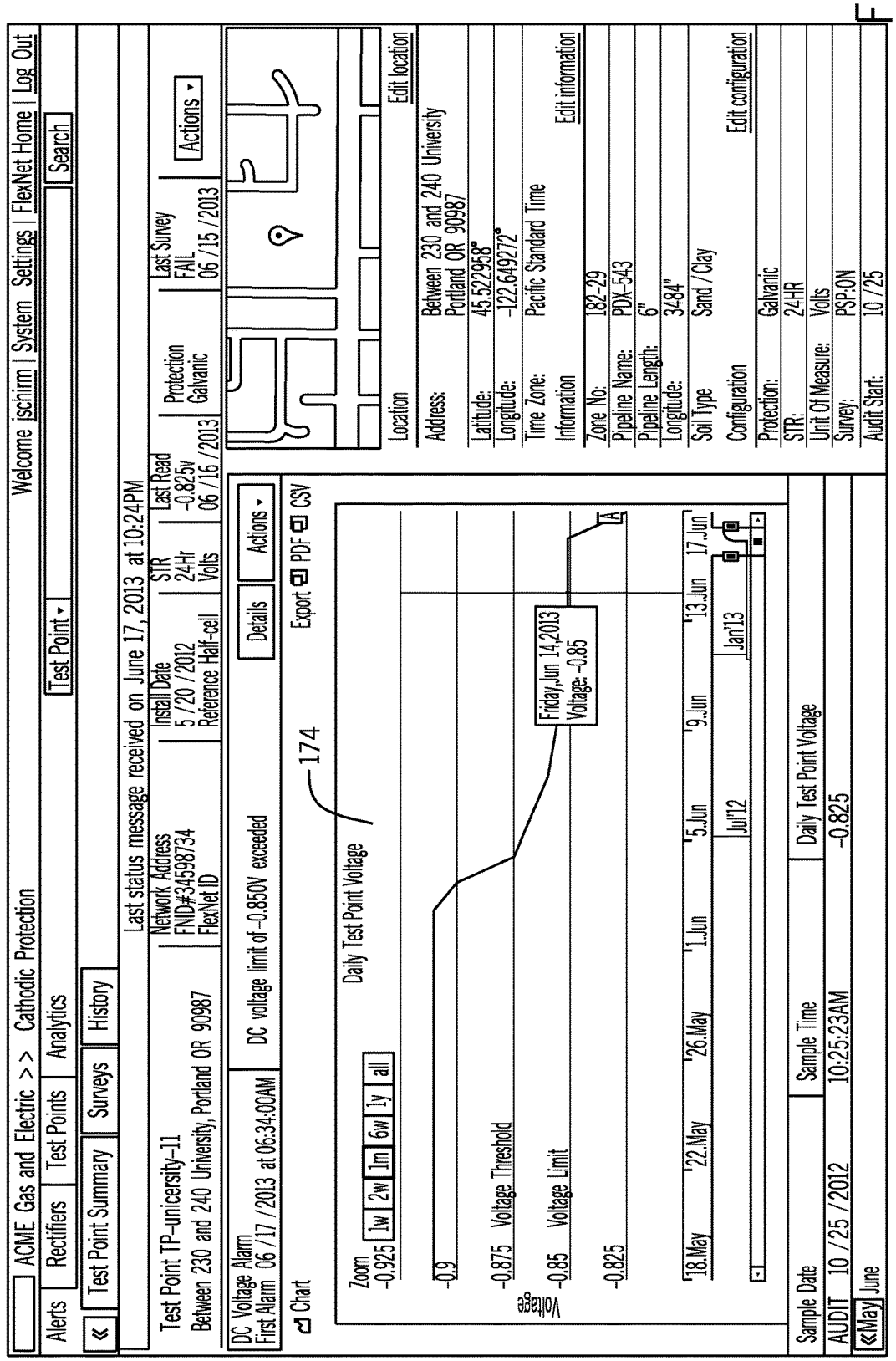
FIG. 19 is a display showing the graphical trend of the measured parameter that generated the alert.

If the user selects the first alert shown in FIG. 17, the user is moved to display screen 164 shown in FIG. 18. In this display screen, the application software presents the user with an indication of the type of alarm 166 as well as the time that the alarm took place. The value 168 that triggered the alarm is presented to the operator. A summary line 170 allows the operator to quickly determine the type of alarm, the type of protection provided by the device, as well as the network address and the installation date of the device. The summary line 170 also indicates the frequency at which the test point is tested. In the embodiment shown, the test point is tested once every twenty-four hours. An action button 172 allows the user to initiate several functions as illustrated, FIG. 19 illustrates the same test point as shown in FIG. 18 with a chart, of the test point voltages illustrated by the graph shown in area 174. The graphical illustration allows the operator to quickly review the change in the recorded value over an extended period of time.

Referring back to FIG. 18, if the operator determines that a service order is required, the operator can quickly order the service order right from the display screen shown in FIG. 18. If the alarm was generated based upon a known service call or other procedure, the operator can simply clear the alarm utilizing one of the action items shown in FIG. 18.

Figure 20:
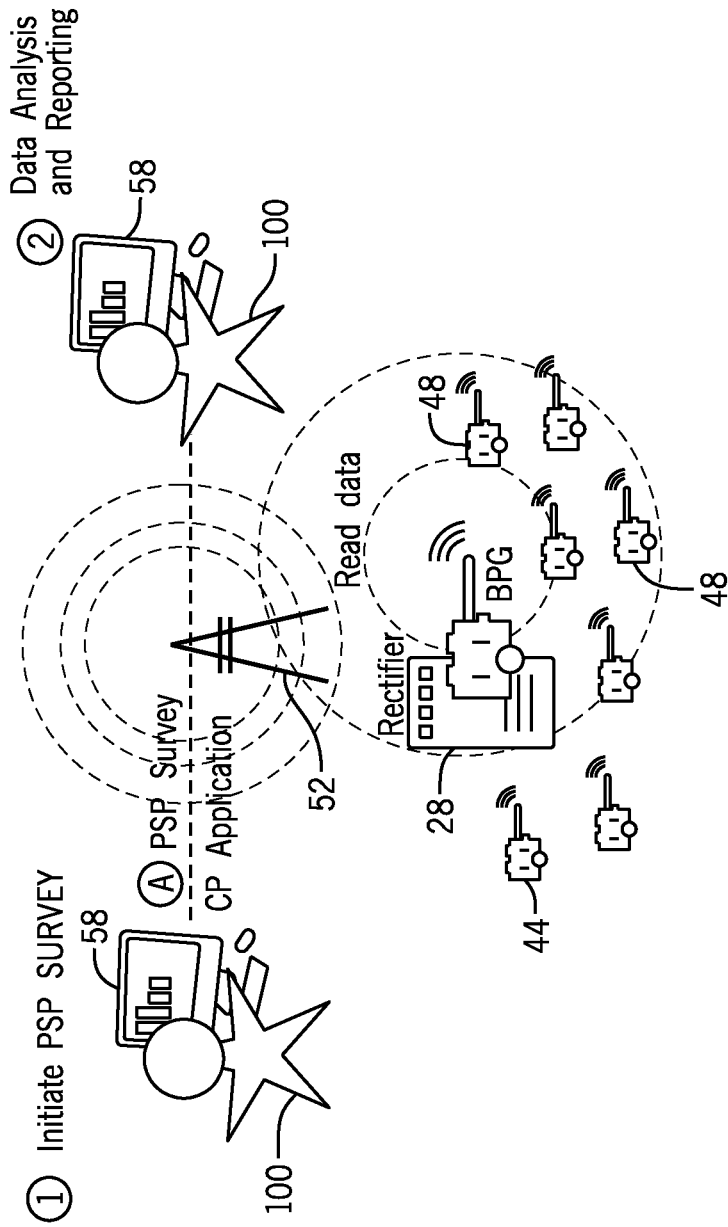
FIG. 20 is a schematic illustration of troubleshooting utilizing different surveys.

In addition to the functions discussed in the alert section of the application software, the cathodic protection software application of the present disclosure can also be utilized to troubleshoot by initiating a survey of the rectifiers and cathodic protection test points. As shown in FIG. 20, an operator 100 can initiate the survey through the display 58. When initiated, the survey request is relayed from the base station 52 to each of the rectifiers 28 and test points 44 that each includes one of the test point monitors 48 or rectifier controllers 49. The information recorded by each of the test point monitors 48 and rectifier controllers 49 is returned to the base station 52 and summarized by the back end server and presented to the operator 100 on the display 58.

Figure 21:
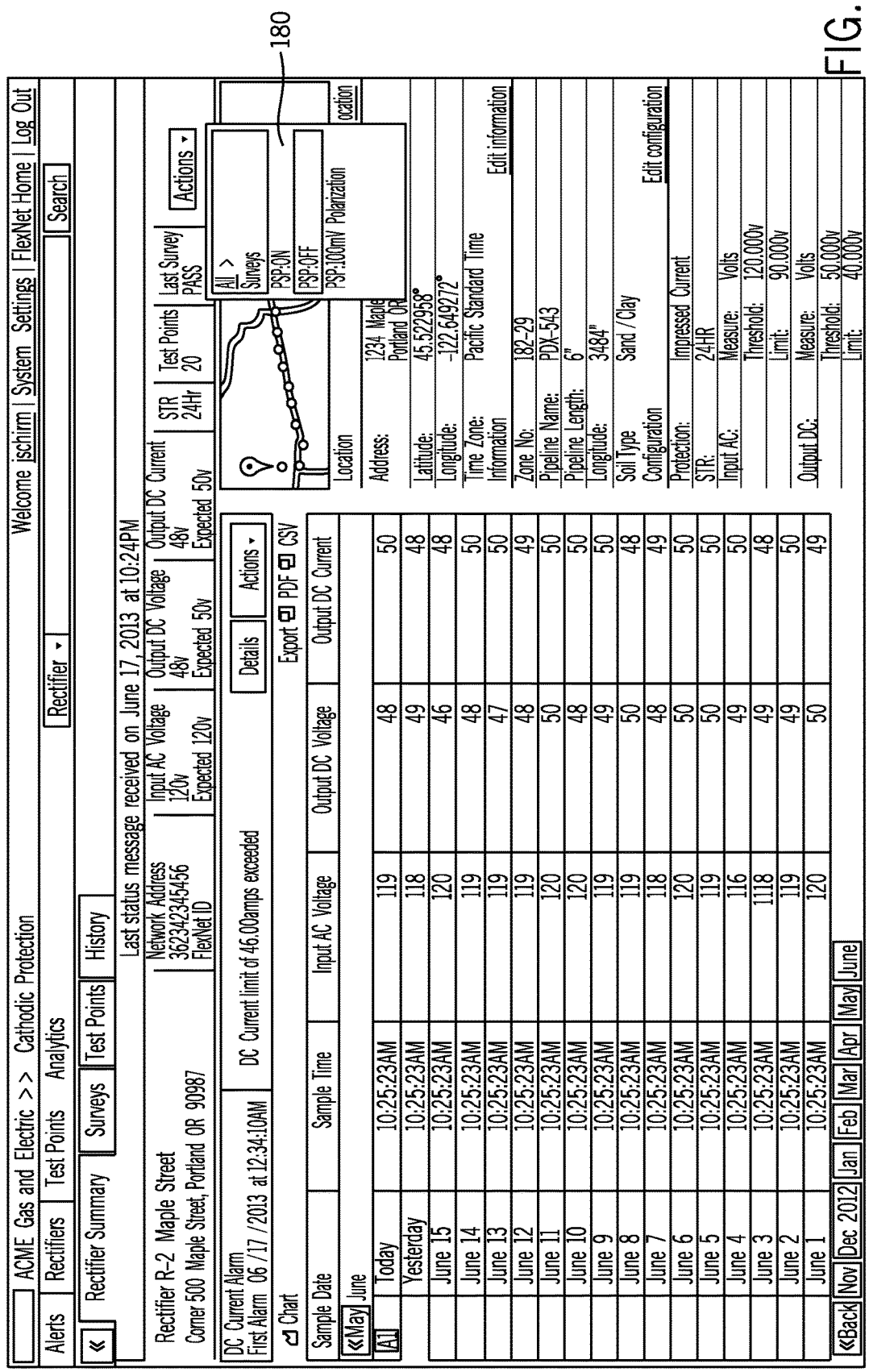
FIG. 21 is a display showing the types of surveys that can be generated.

FIG. 21 illustrates the ability of the operator to initiate a PSP-off procedure shown in the selection box 180. Once the survey has been initiated, each of the test points carries out the survey function and returns the measured value to the back end server. The back end server, in turn, presents the results of the survey in the listing 182 shown in FIG. 22. In this manner, the operator can conduct a survey of each of the rectifiers. In the display 182 shown in FIG. 22, the rectifiers that include a tamper door open alarm 184 are displayed to an operator.

FIG. 23 illustrates a display 186 of each of the test points that has had a DC alarm voltage 188. The results are sorted by most recent and are easily presented to an operator such that the operator can act upon the alerts in a quick and decisive manner.

Figure 24:
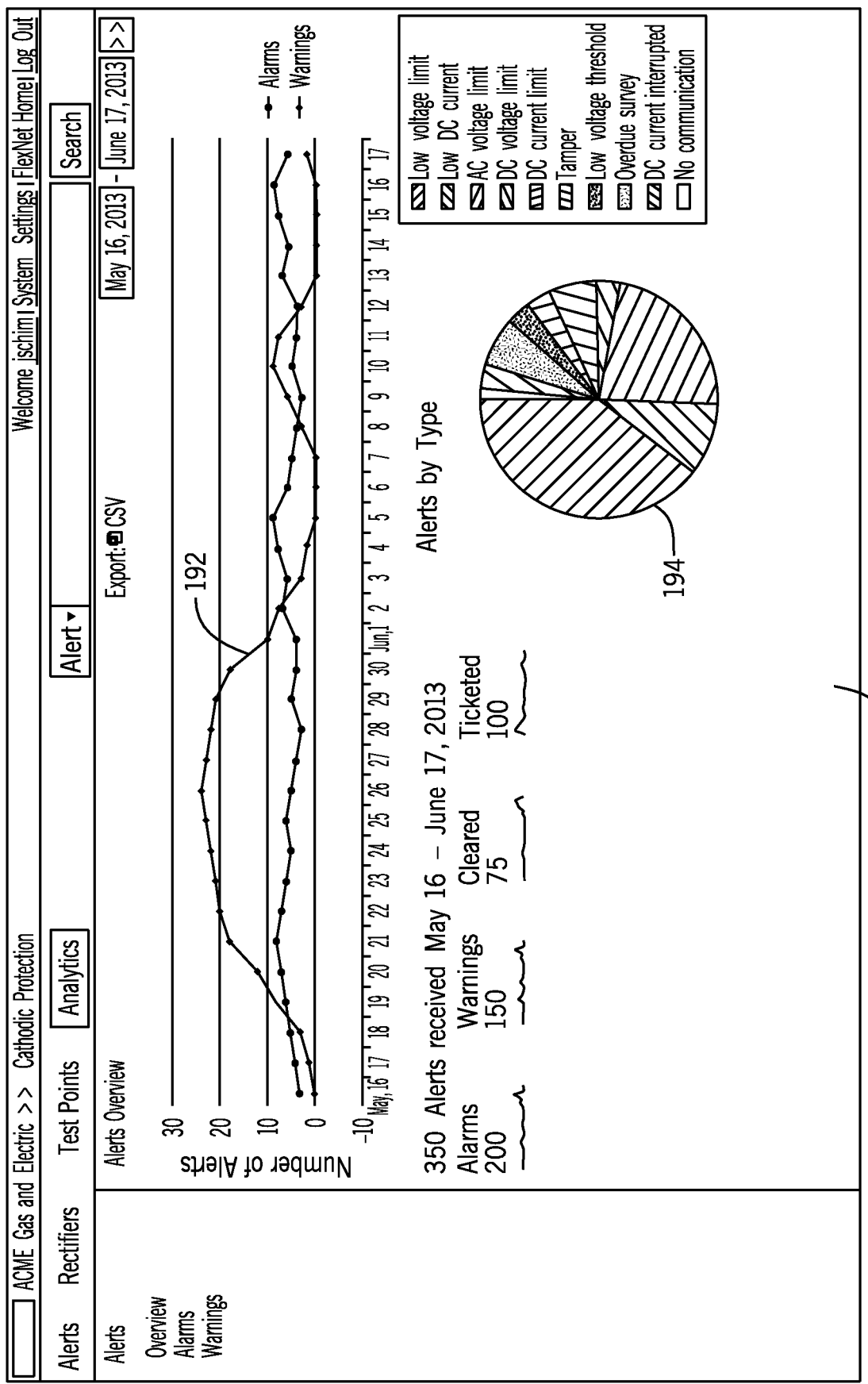
FIG. 24 is a display showing the alert overviews over a one-month period.
Figure 25:
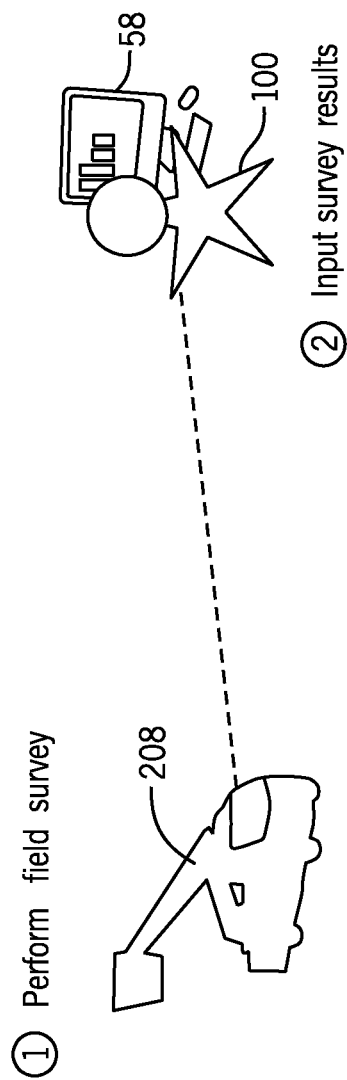
FIG. 25 is a schematic illustration showing the entry of measurements utilizing manual surveys.

FIG. 24 illustrates an analytic display 190 that allows an operator to quickly determine the number of alerts that have been received over a predetermined period of time. In the embodiment shown, the alerts are shown for a one month period. A graphical display 192 shows the displays on a daily basis while the pie chart display 194 shows the types of alerts that were generated during this same one month period. As the analytics display indicates, an operator can quickly assess the number of alerts generated, the type of alerts generated and create a variety of reports while sitting at the terminal without having to individually pull each of the test points and rectifiers.

In addition to automatically polling each of the devices, trained field personnel can perform a field survey as illustrated by step 208. Based upon the results of the field survey, the technician can manually import the results into the back end server for display 58.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A system for monitoring the cathodic protection of a pipeline, comprising:
   a plurality of differently configured test points geographically dispersed at a plurality of locations along the pipeline;
   at least one rectifier associated with the plurality of test points, wherein the rectifier is operable to impart a protection voltage on the pipeline;
   a plurality of test point monitors each having the same configuration and each including an internal switching element and each being in communication with one of the plurality of differently configured test points through a configurable terminal block that allows the test point monitor to determine at least a voltage measurement associated with the pipeline at the location of the test point regardless of the configuration of the test point, wherein each of the test point monitors includes a control unit including firmware operable to control operation of the switching element to determine the voltage measurement based on the configuration of the test point and a transceiver to both transmit and receive wireless communication signals;
   a rectifier controller in communication with the rectifier to control the application of the protection voltage on the pipeline,
   at least one base station located remotely from the test point monitors and the rectifier controller and in communication with the test point monitors and the rectifier controller;
   a back end server in communication with the base station, wherein the back end server receives at least the voltage measurements from the plurality of test point monitors and communicates commands to the test point monitors and the rectifier controller; and
   an operator interface terminal associated with the back end server to display the measurements from the plurality of test point monitors.

2. The system of claim 1 wherein the operator interface terminal includes a software application operable to display the voltage measurements from the test point monitors.

3. The system of claim 1 wherein each of the plurality of test point monitors is operable to generate an alert when the voltage measurements fall below a critical voltage level.

4. The system of claim 2 wherein the software application displays textual alerts based upon the voltage measurements received from the plurality of test point monitors.

5. The system of claim 2 wherein the software application visually displays the alerts received based upon the voltage measurements from the test point monitors.

6. The system of claim 2 wherein the software application presents an operator with a plurality of actions for each of the alerts received from the test point monitors.

7. The system of claim 2 wherein the software application allows an operator to initiate measurements at the plurality of test point monitors.

* * * * *